(12) United States Patent
Tsukakoshi et al.

(10) Patent No.: US 8,324,714 B2
(45) Date of Patent: Dec. 4, 2012

(54) SEMICONDUCTOR DEVICE AND METHOD FOR MAKING THE SAME

(75) Inventors: Jun Tsukakoshi, Yokohama (JP); Yoshitaka Aiba, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/956,635

(22) Filed: Nov. 30, 2010

(65) Prior Publication Data

US 2011/0127647 A1    Jun. 2, 2011

(30) Foreign Application Priority Data

Dec. 1, 2009   (JP) ................................. 2009-273148

(51) Int. Cl.
*H01L 23/544* (2006.01)
*H01L 21/78* (2006.01)

(52) U.S. Cl. ......... 257/620; 257/E23.194; 257/E21.536; 438/460; 438/461; 438/462; 438/463

(58) Field of Classification Search .................. 257/620, 257/E23.194, E21.536; 438/460, 461, 462, 438/463

See application file for complete search history.

(56) References Cited

U.S. PATENT DOCUMENTS

| | | | |
|---|---|---|---|
| 2007/0196956 A1* | 8/2007 | Imoto et al. | 438/124 |
| 2007/0284755 A1 | 12/2007 | Nomoto et al. | |
| 2008/0006910 A1* | 1/2008 | Miyata et al. | 257/622 |
| 2011/0057297 A1* | 3/2011 | Lee et al. | 257/620 |

FOREIGN PATENT DOCUMENTS

| | | |
|---|---|---|
| JP | 2007-329396 A | 12/2007 |
| JP | 2008-130880 A | 6/2008 |
| JP | 2008-166352 A | 7/2008 |

* cited by examiner

*Primary Examiner* — Peniel M Gumedzoe
(74) *Attorney, Agent, or Firm* — Fujitsu Patent Center

(57) ABSTRACT

A semiconductor device includes a semiconductor substrate having a main surface in which a semiconductor element region where a plurality of functional elements are formed is formed; a multilevel wiring layer disposed on the main surface of the semiconductor substrate; a first organic insulating material layer disposed on the multilevel wiring layer; a groove that penetrates the multilevel wiring layer on a scribe region that surrounds the semiconductor element region; and an organic insulating material that is spaced from the first organic insulating material layer and disposed in the groove.

18 Claims, 25 Drawing Sheets

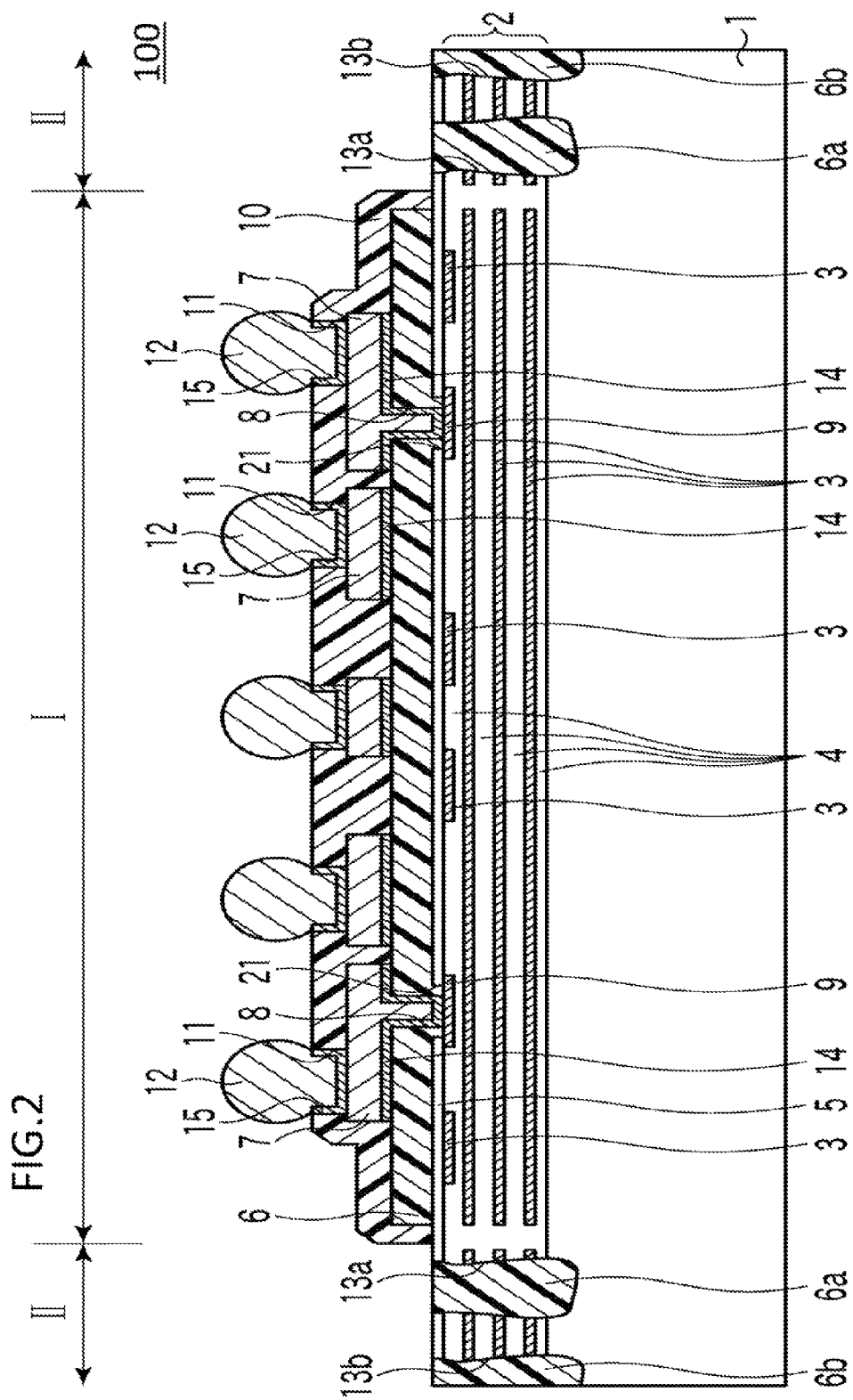

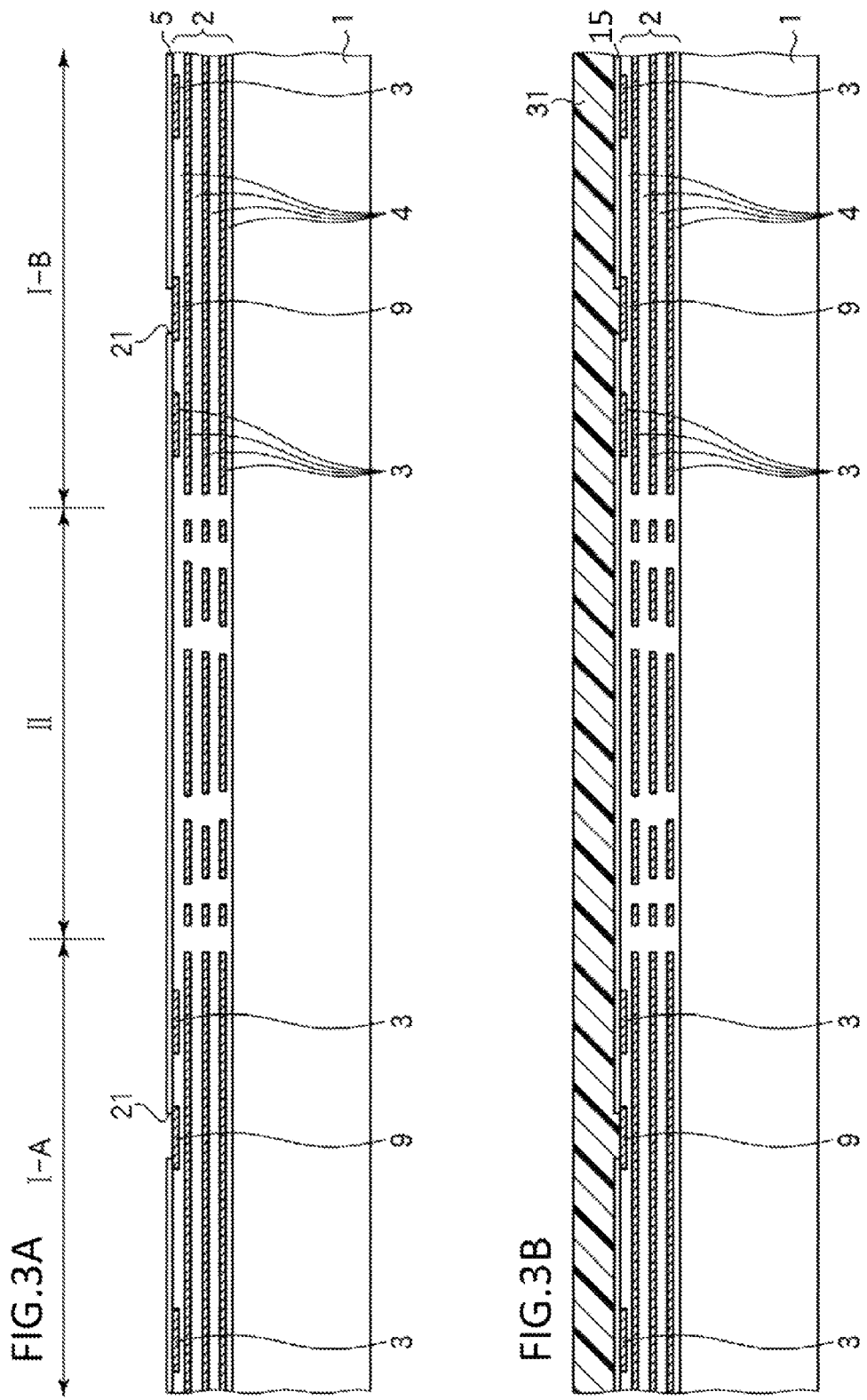

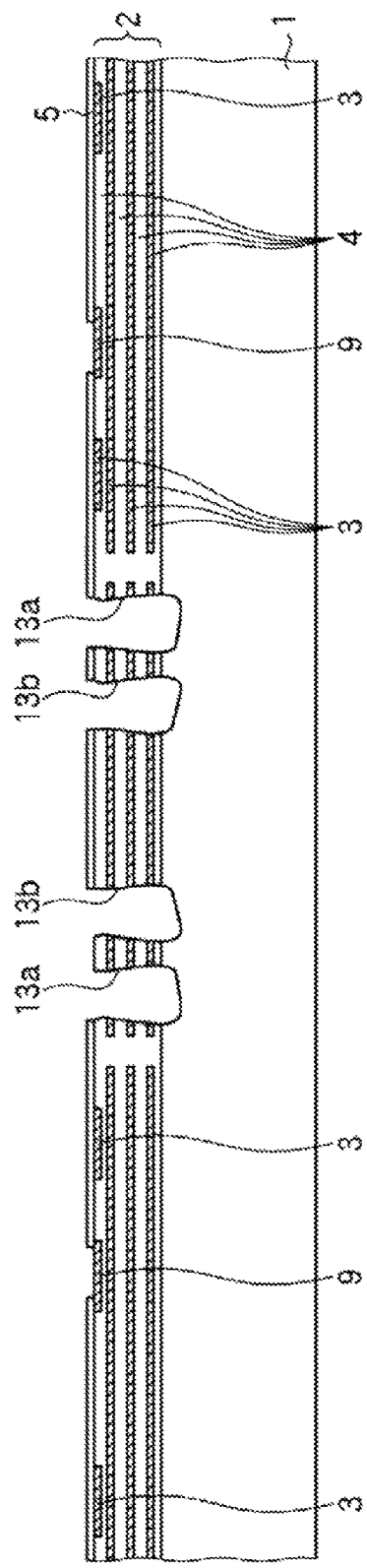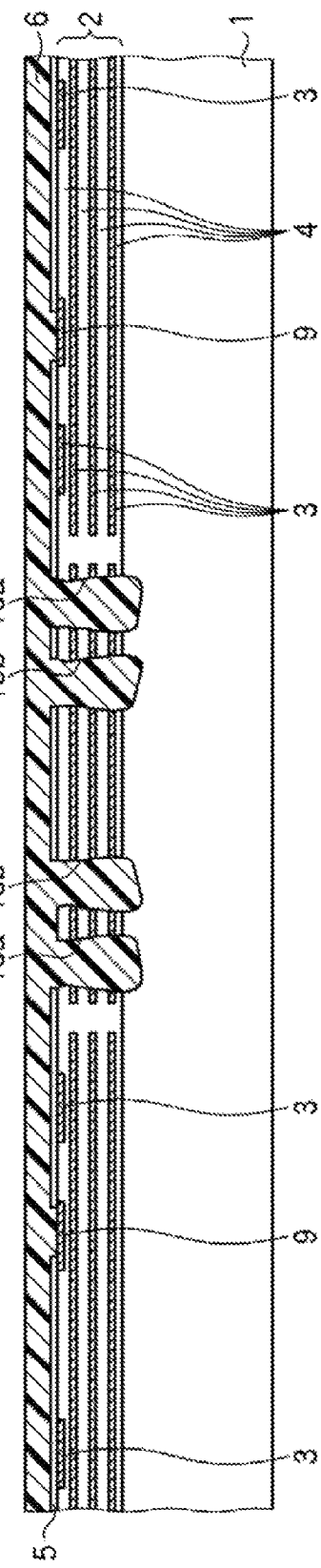

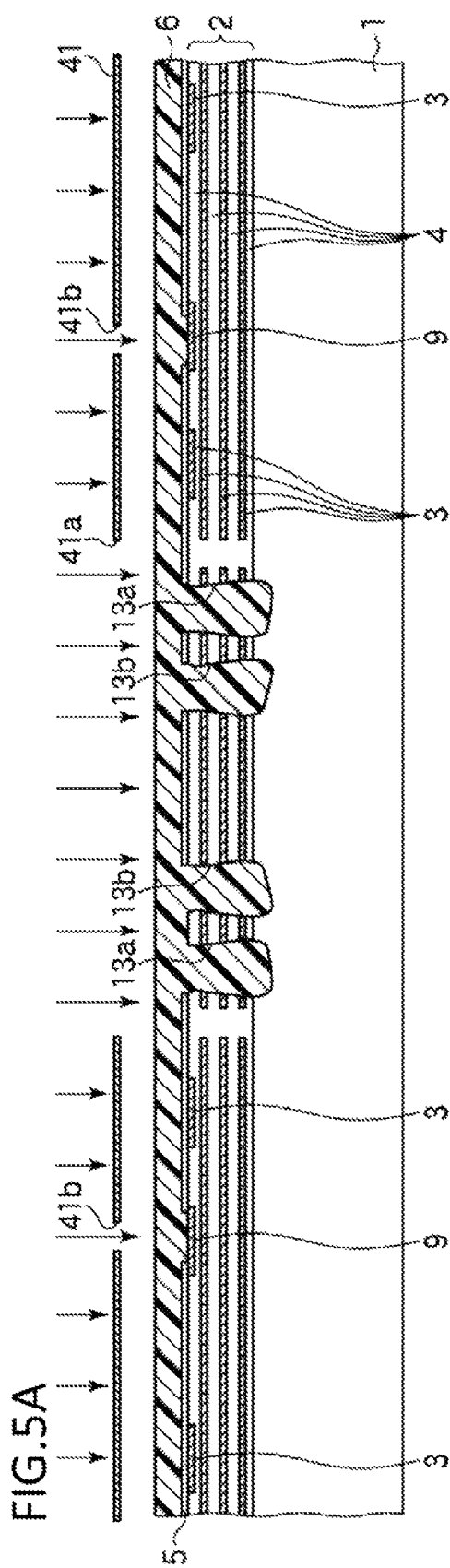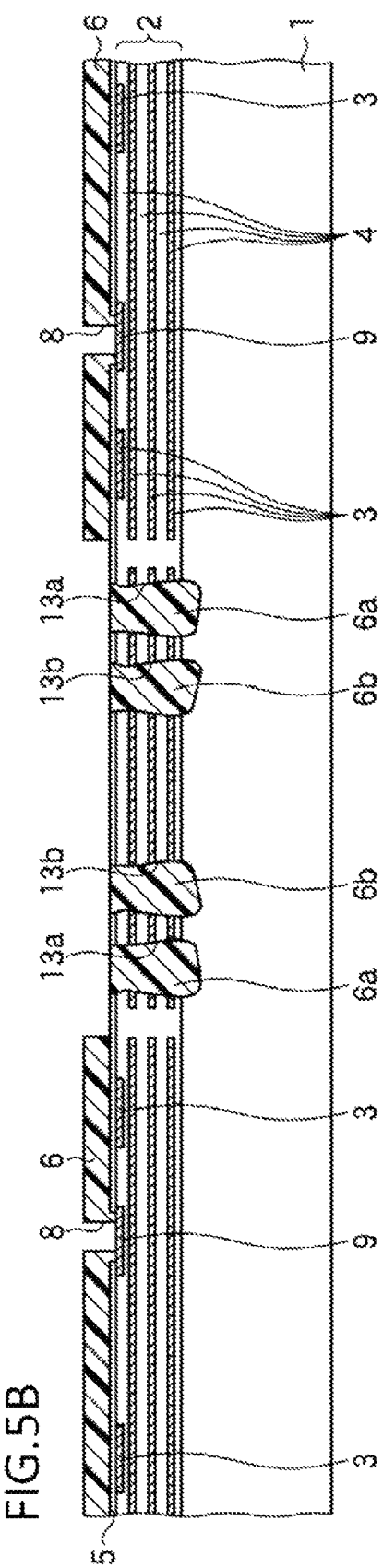
FIG.5A
FIG.5B

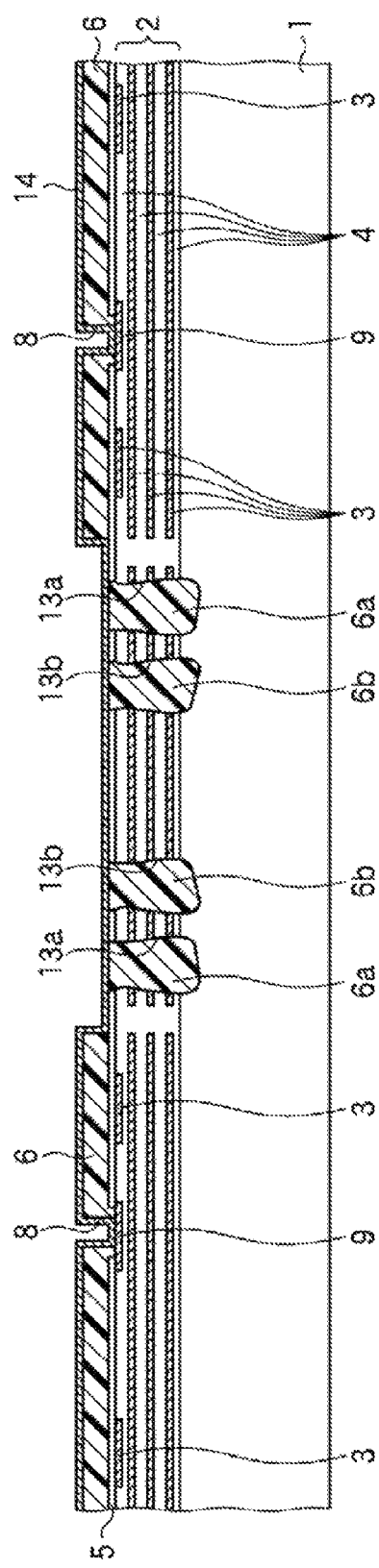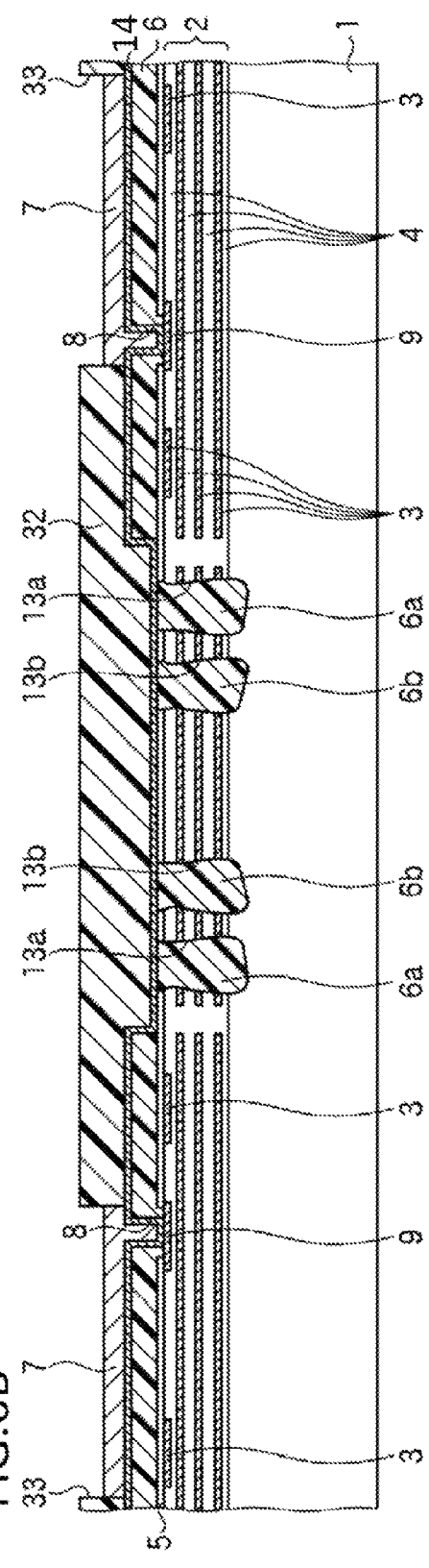

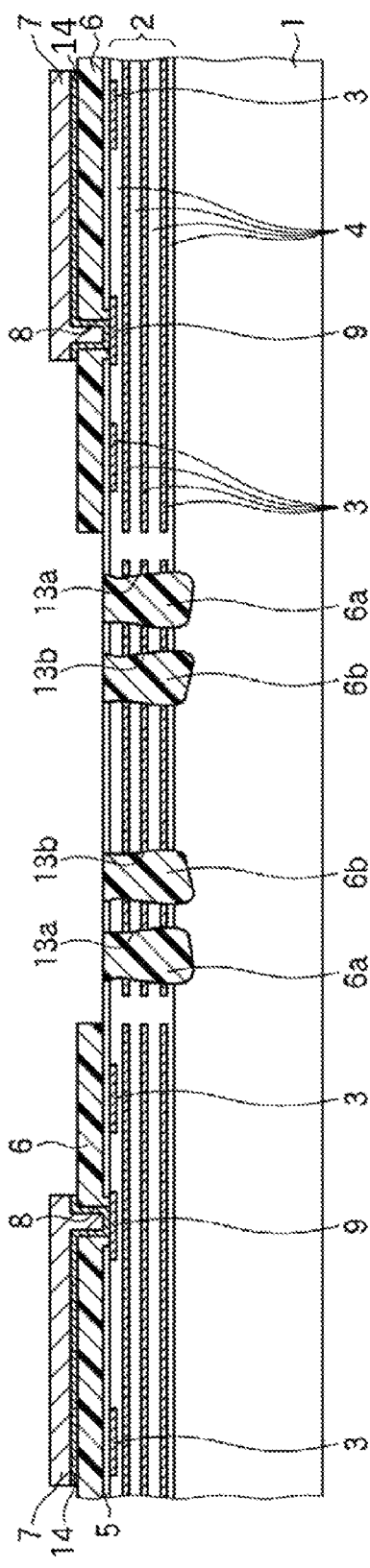
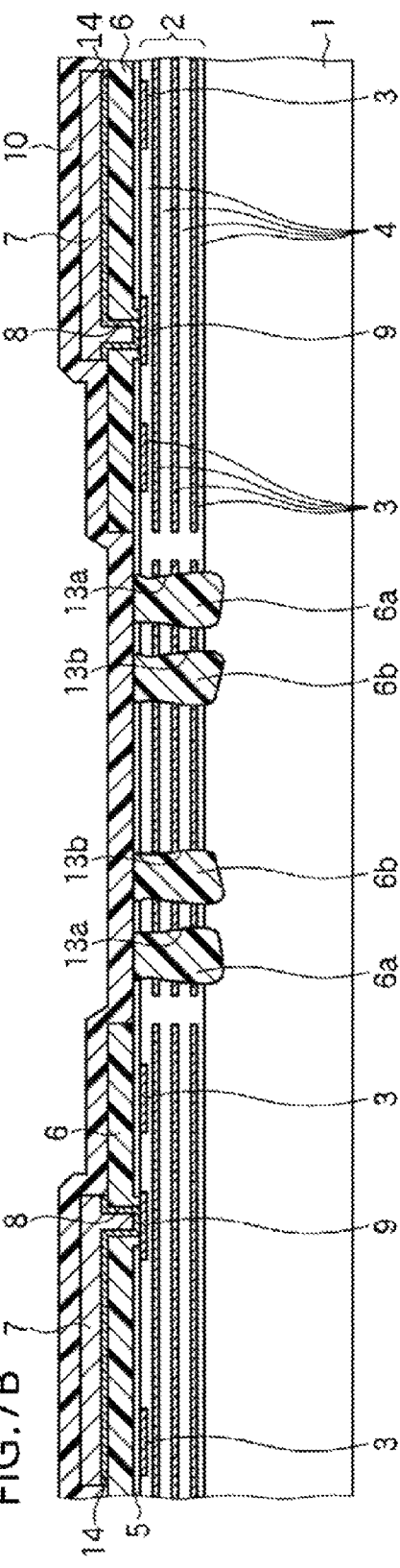

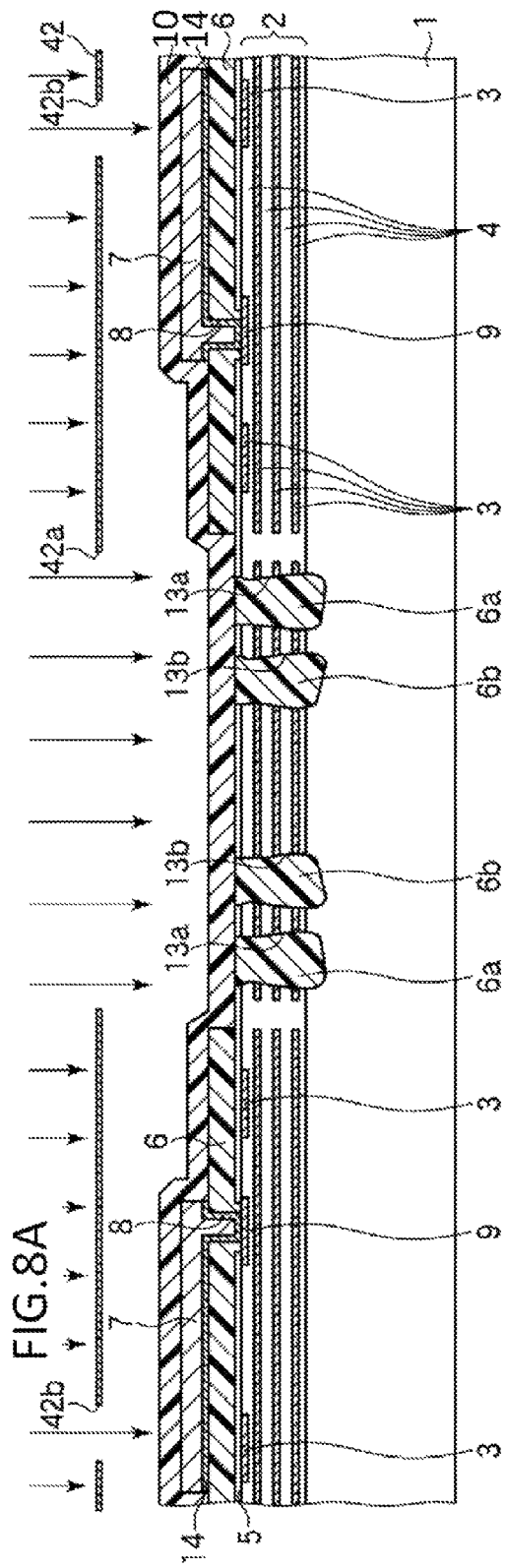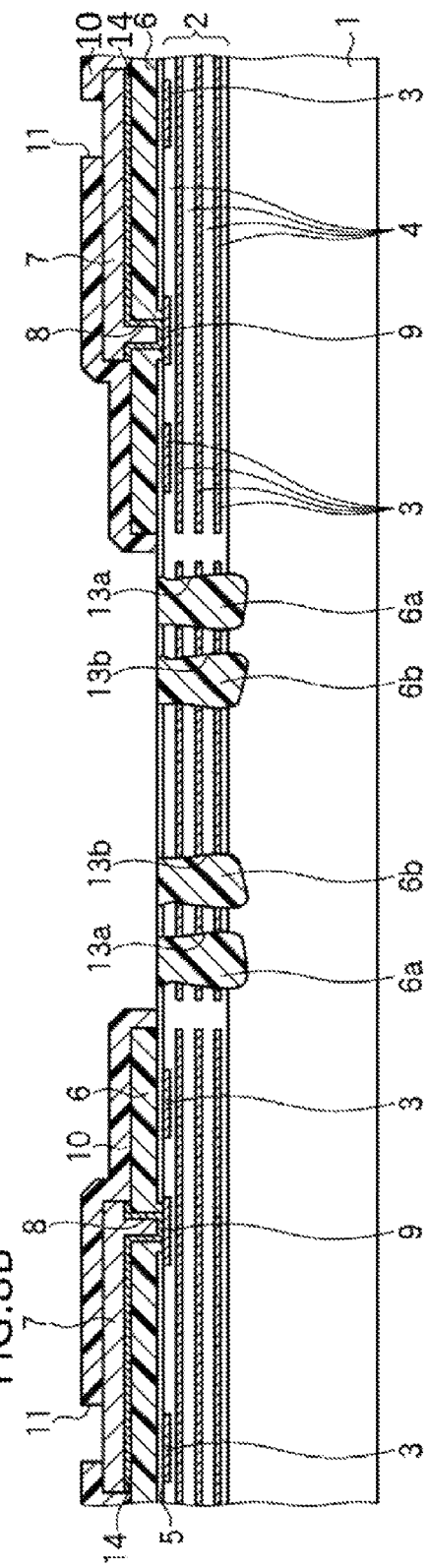

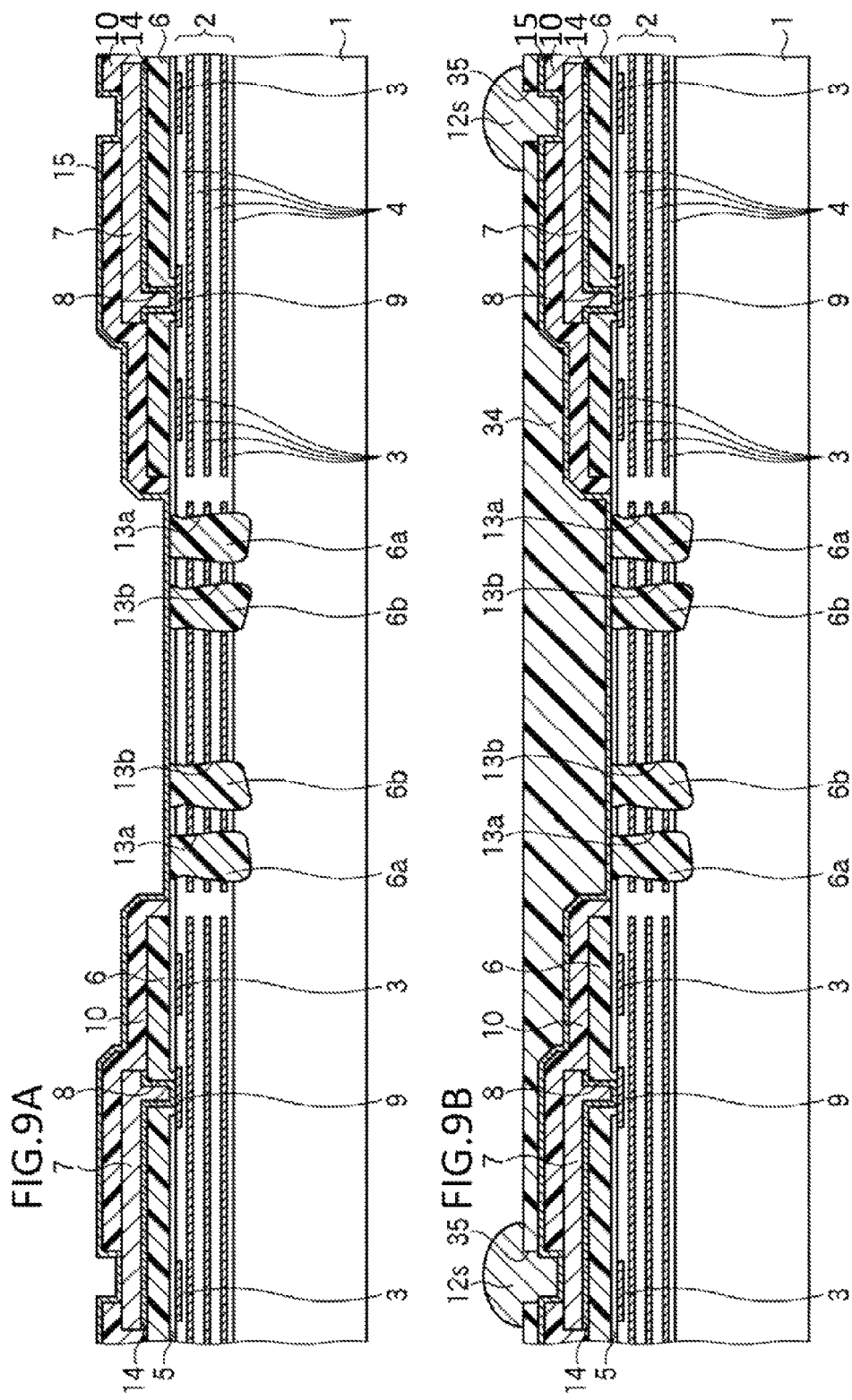

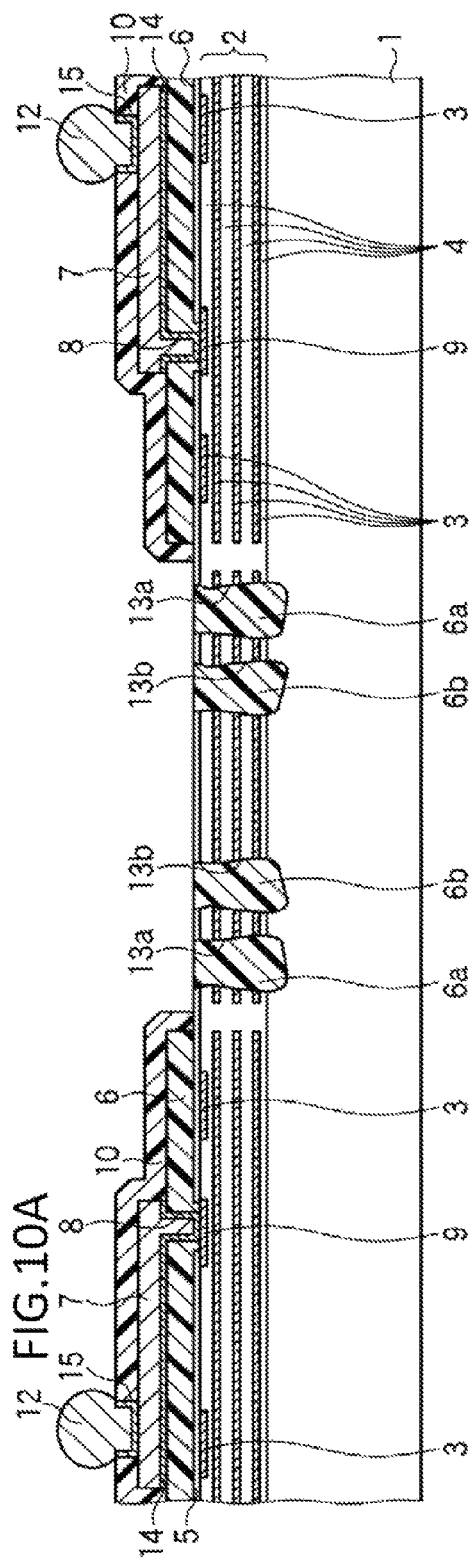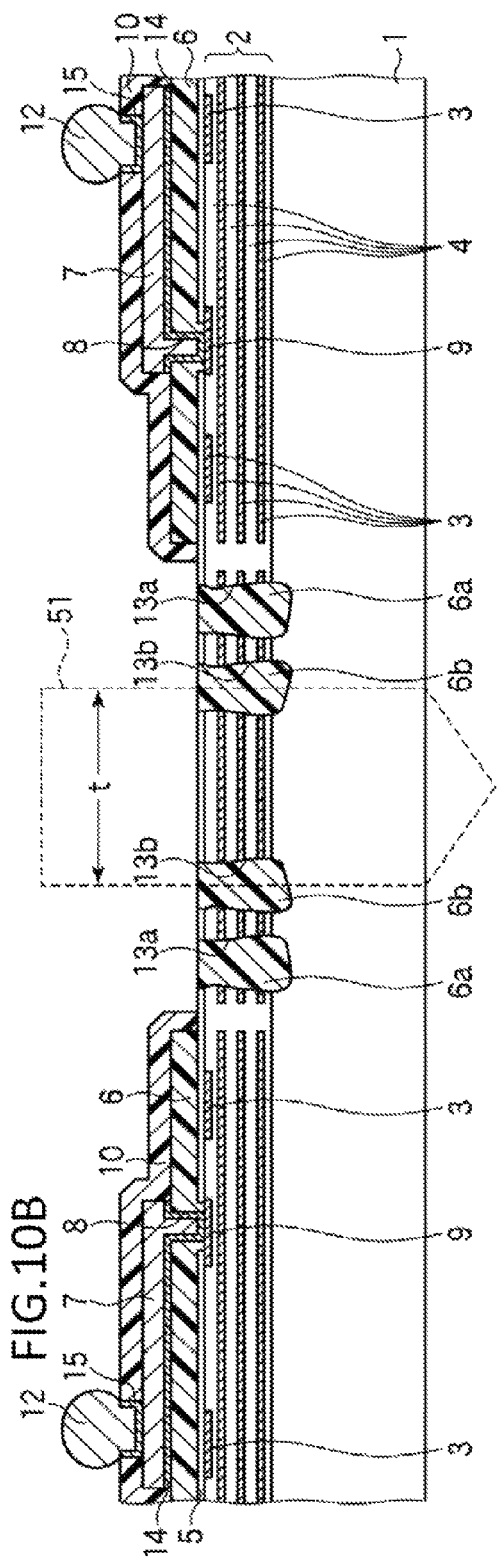

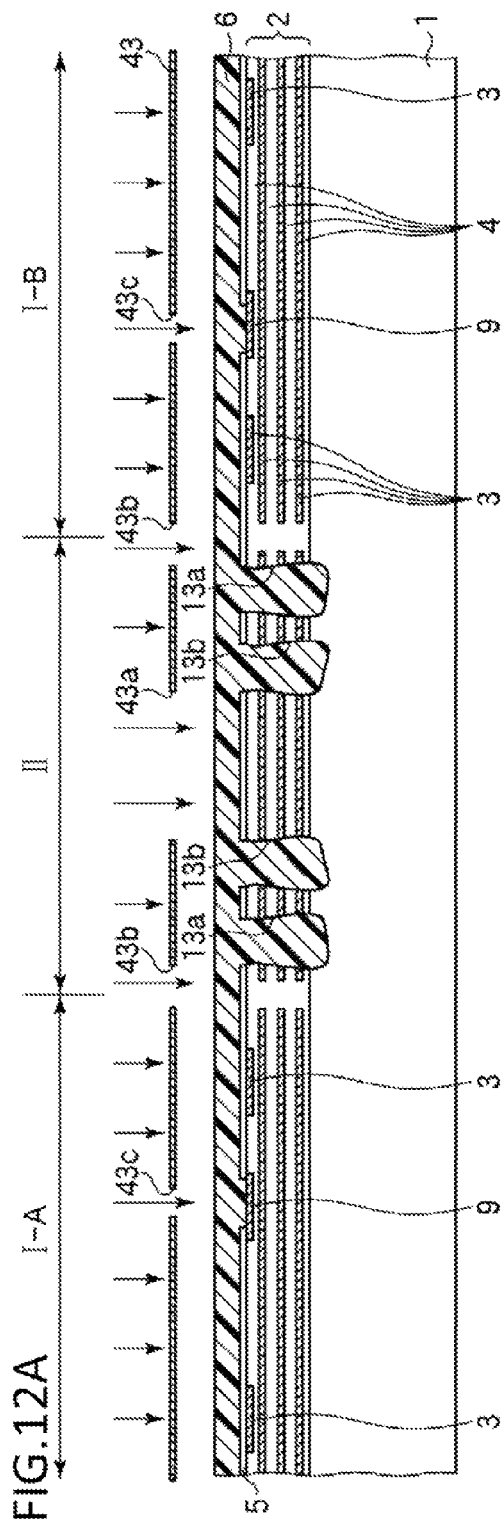
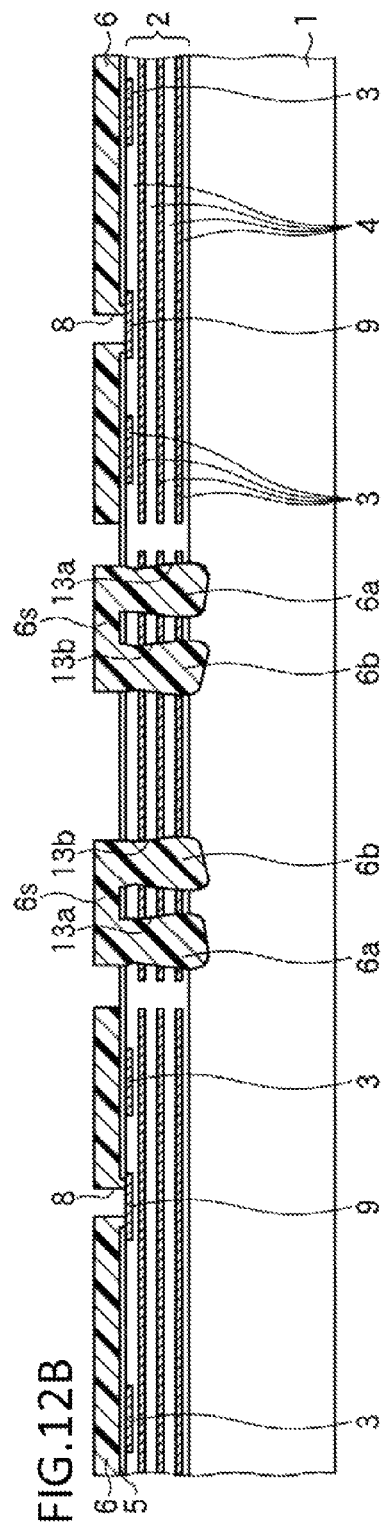
FIG.12A
FIG.12B

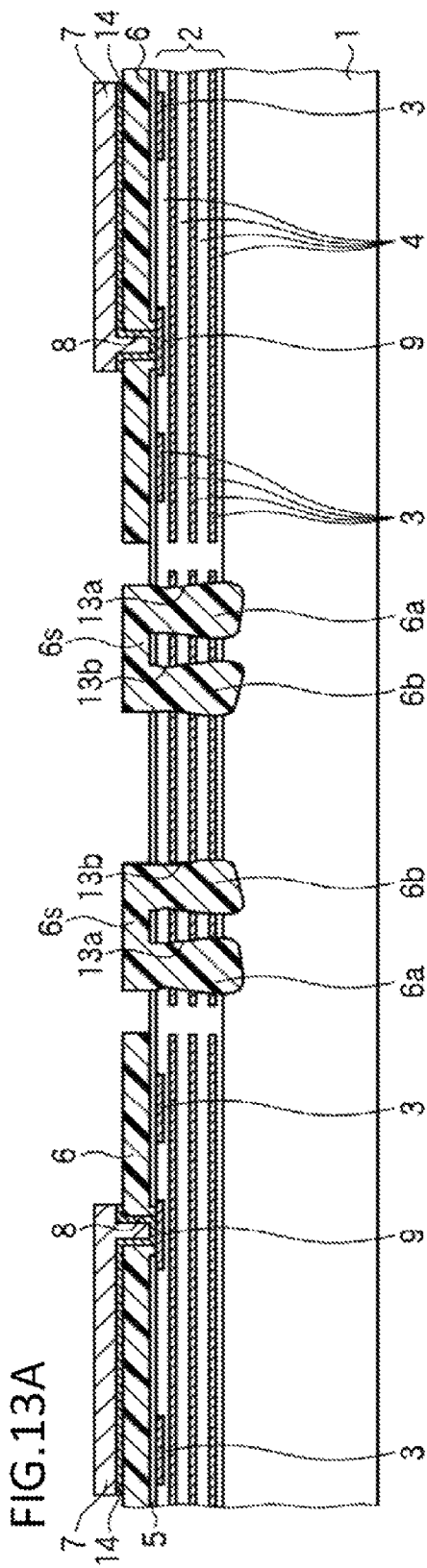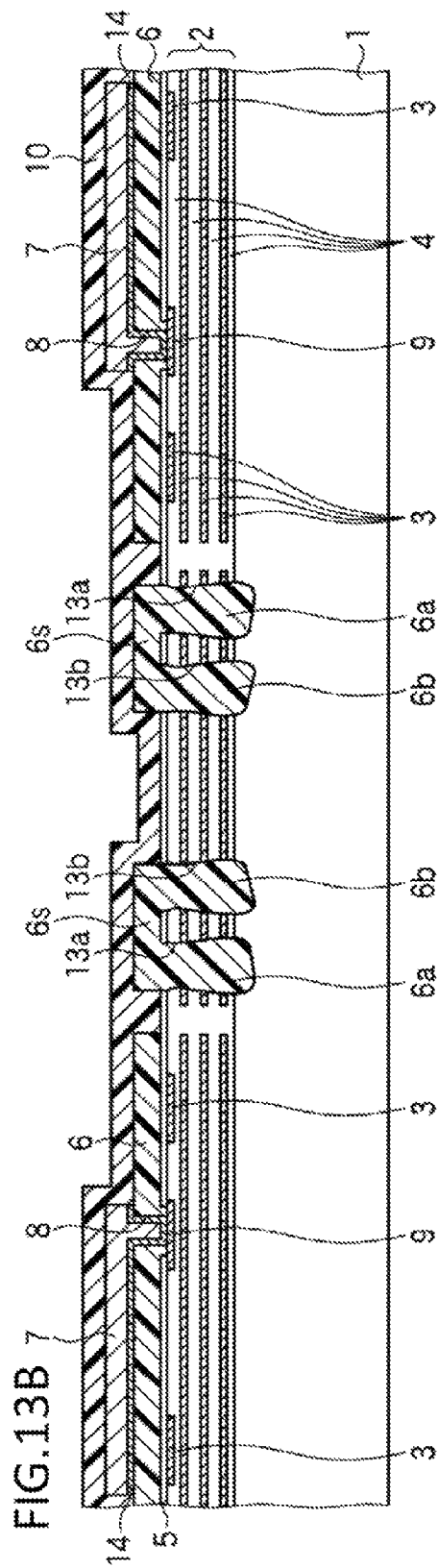

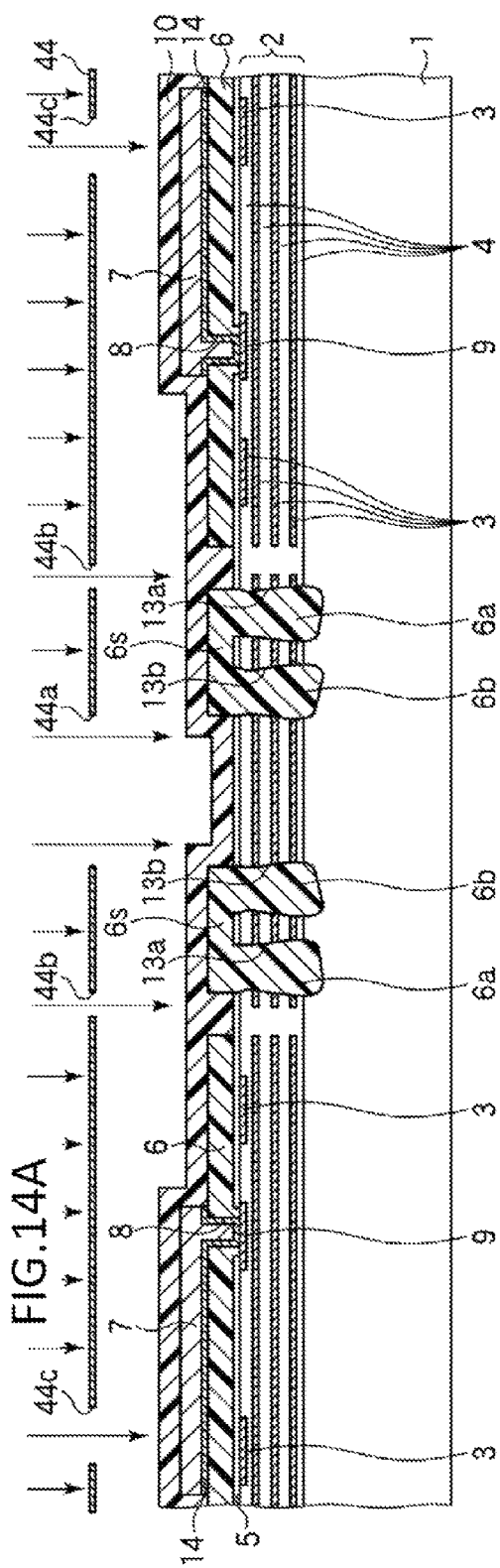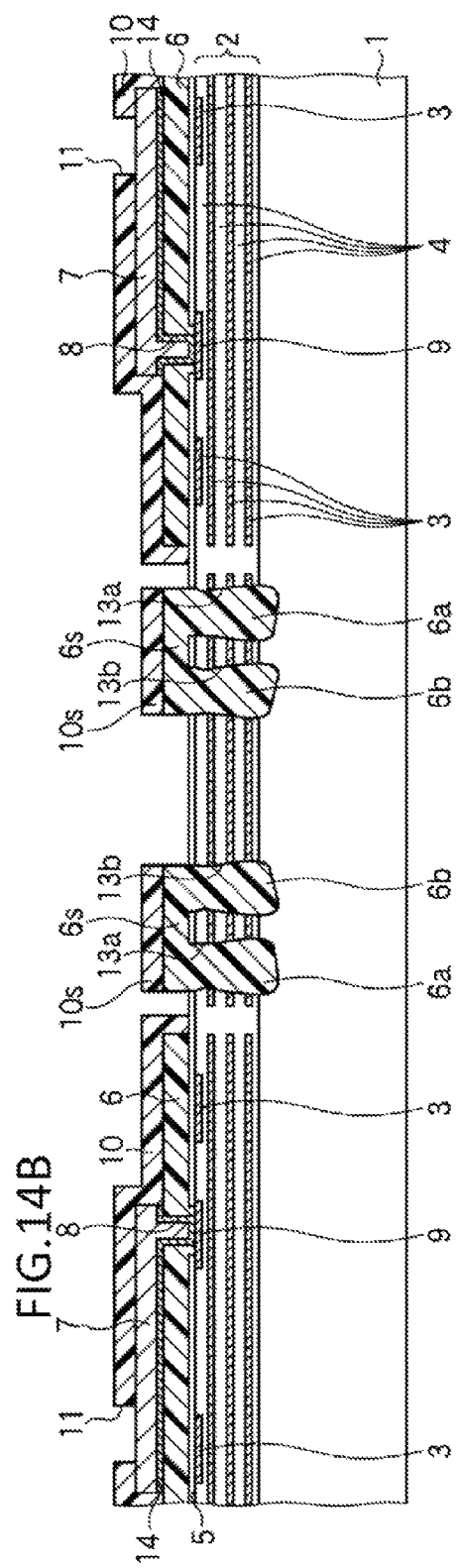

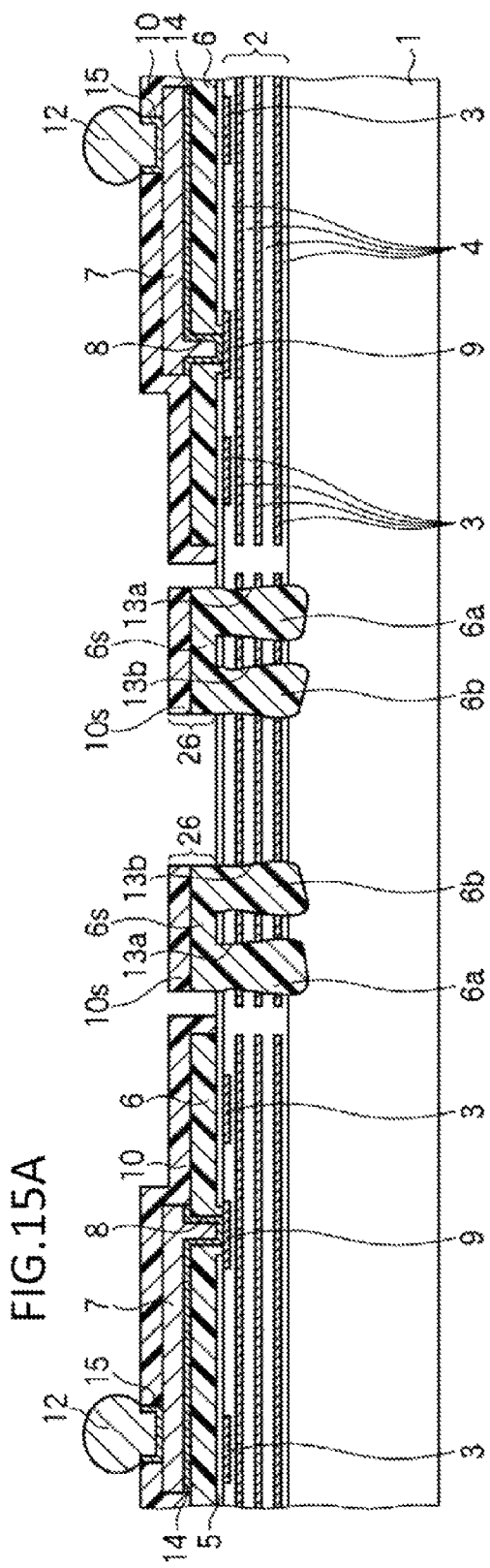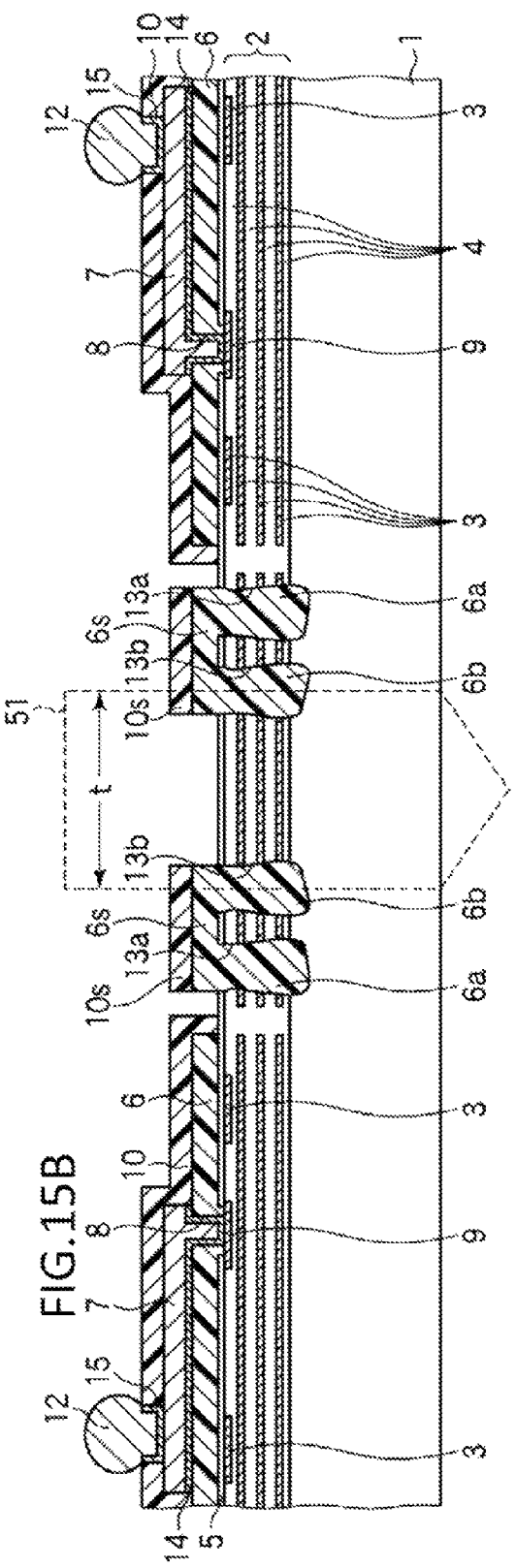

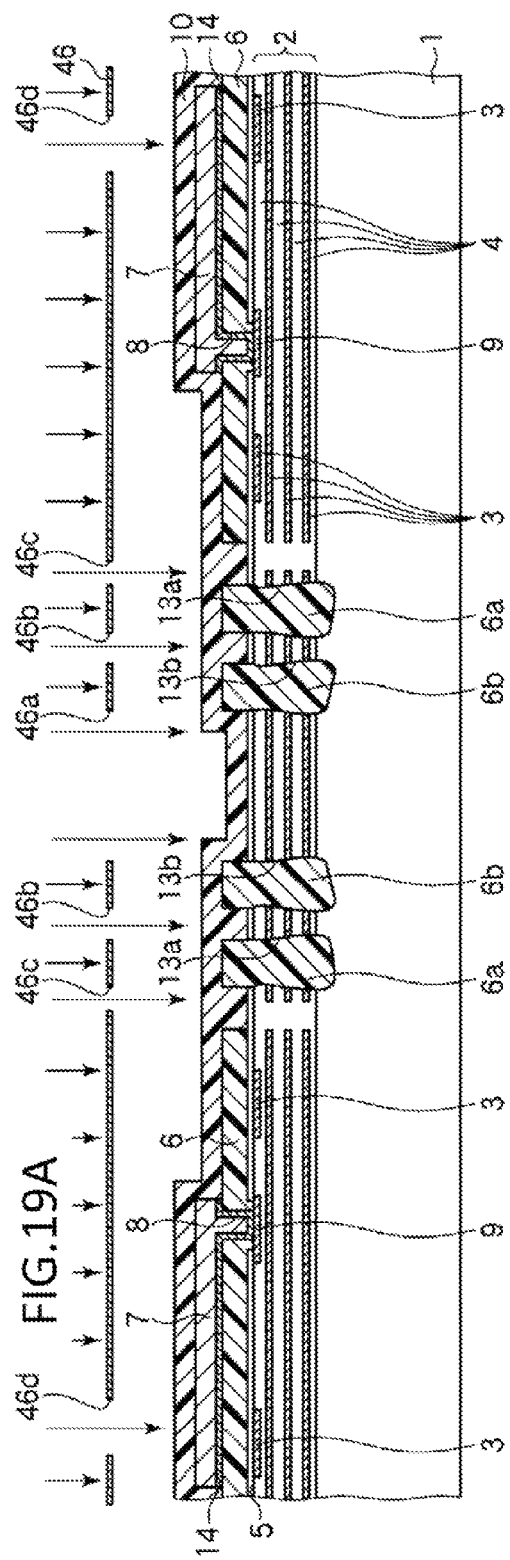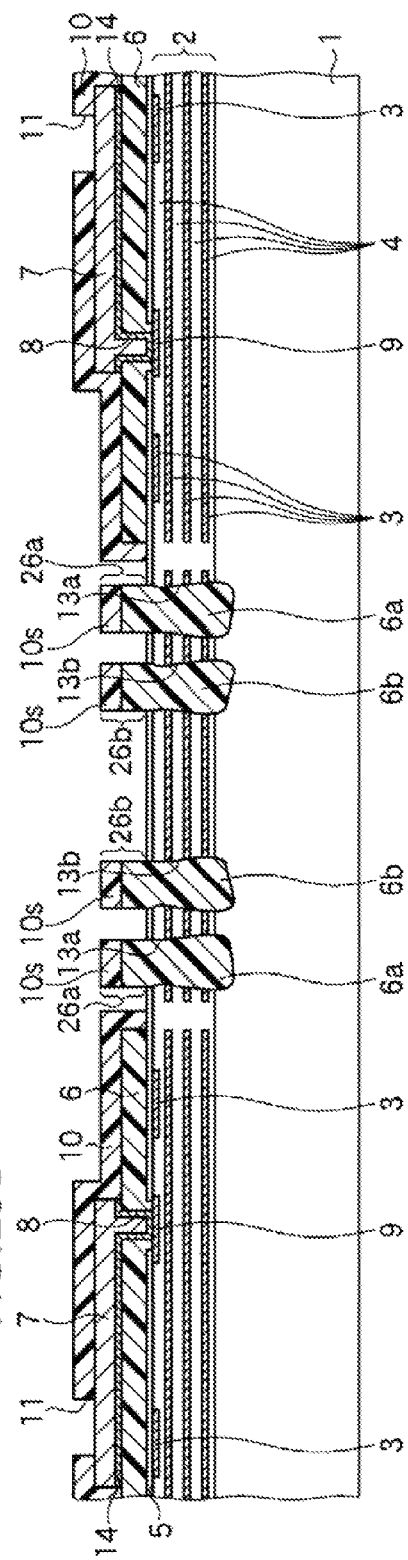

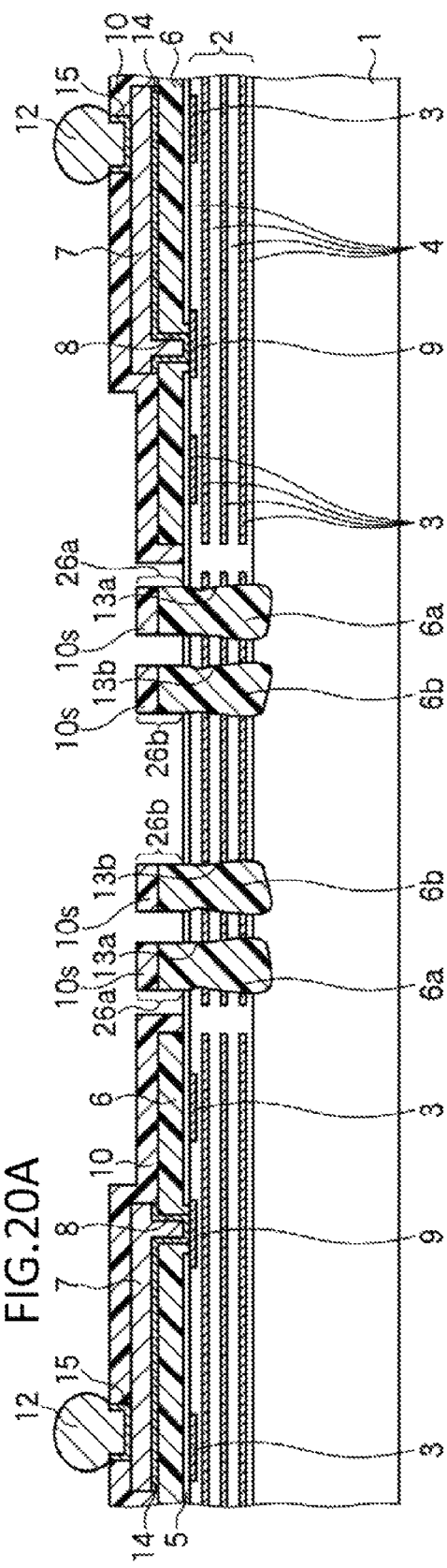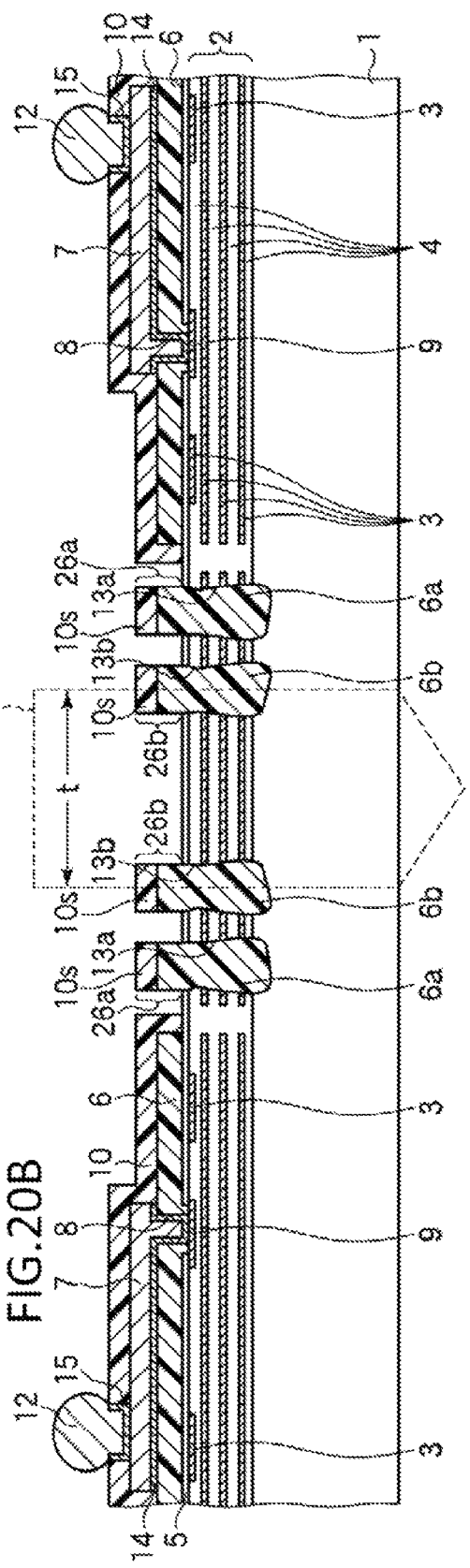

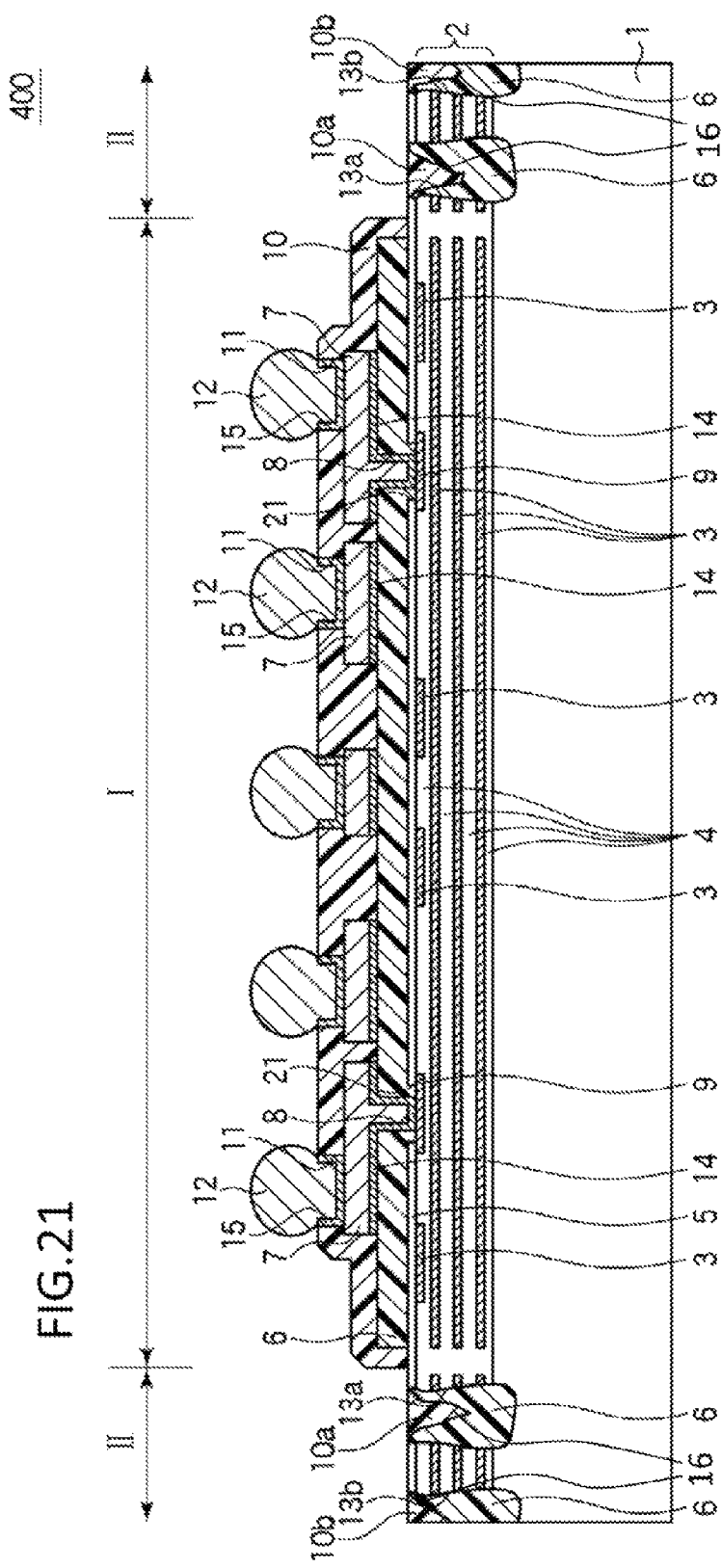

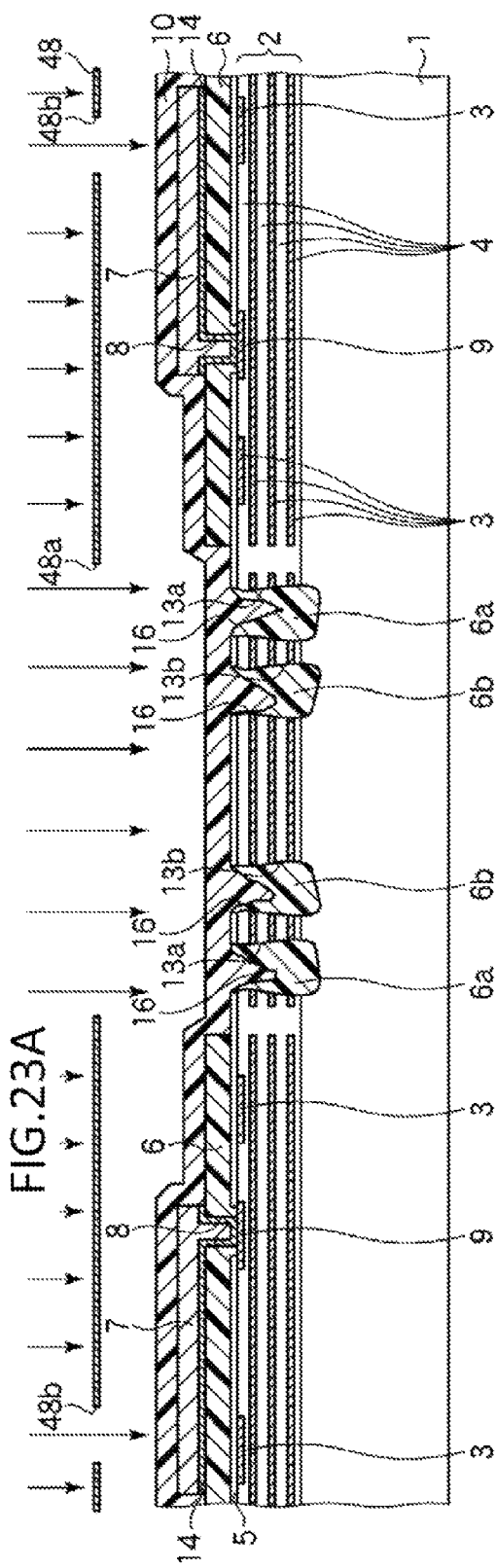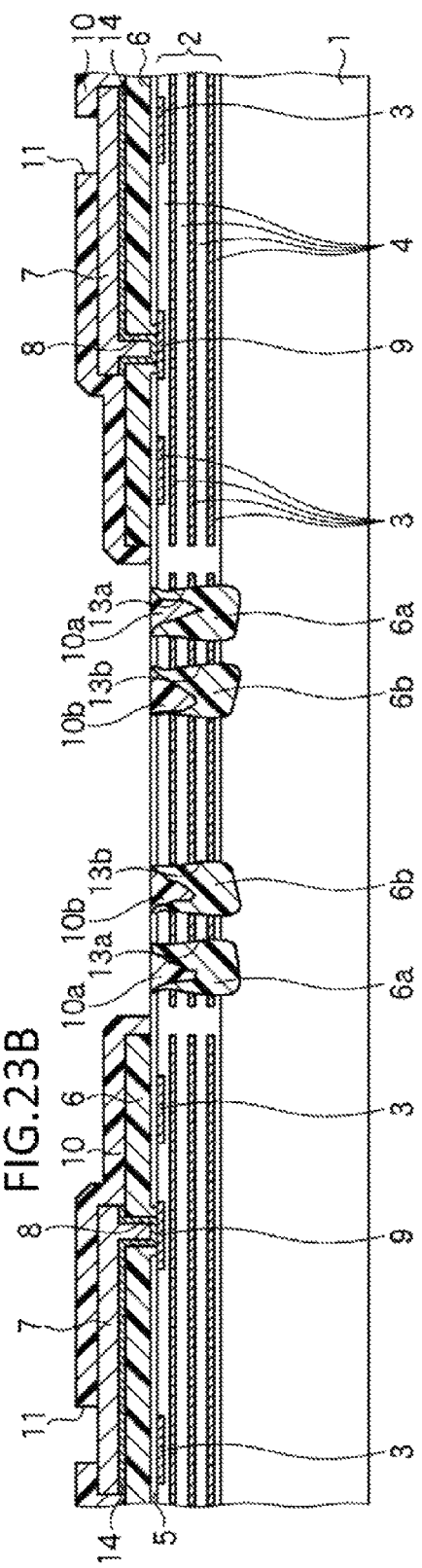

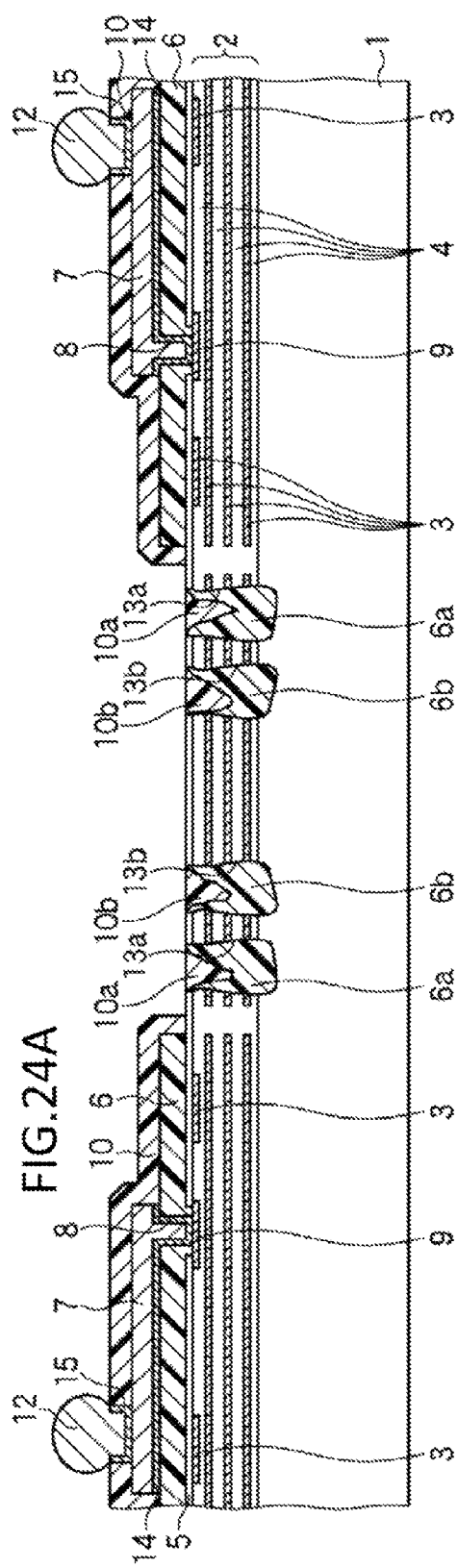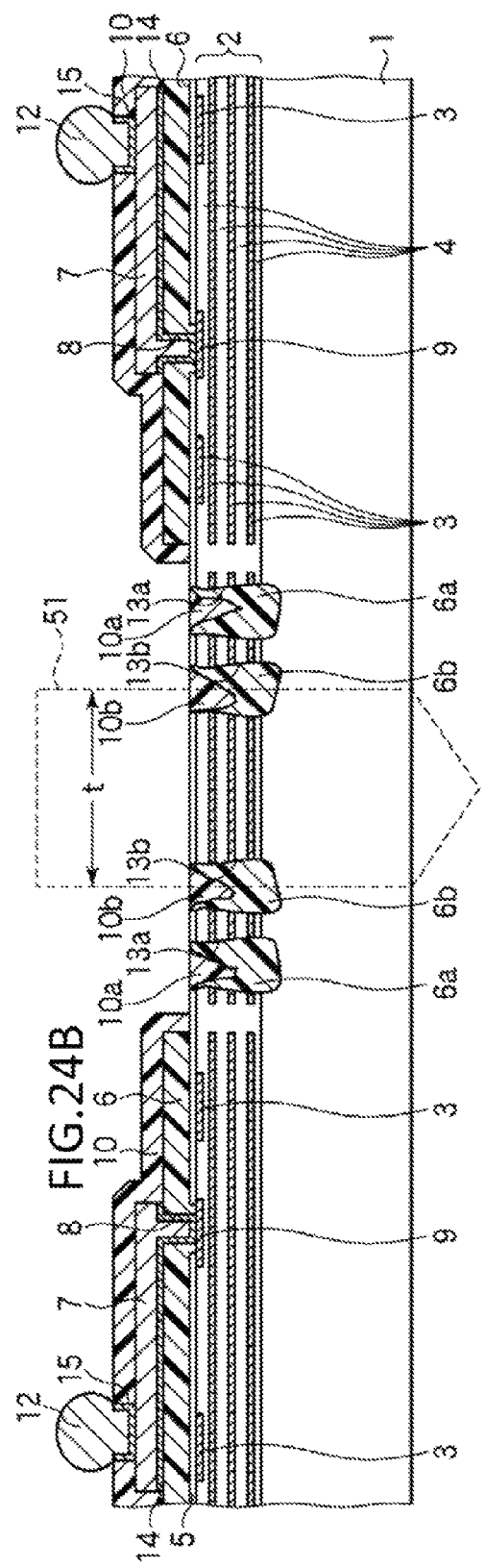

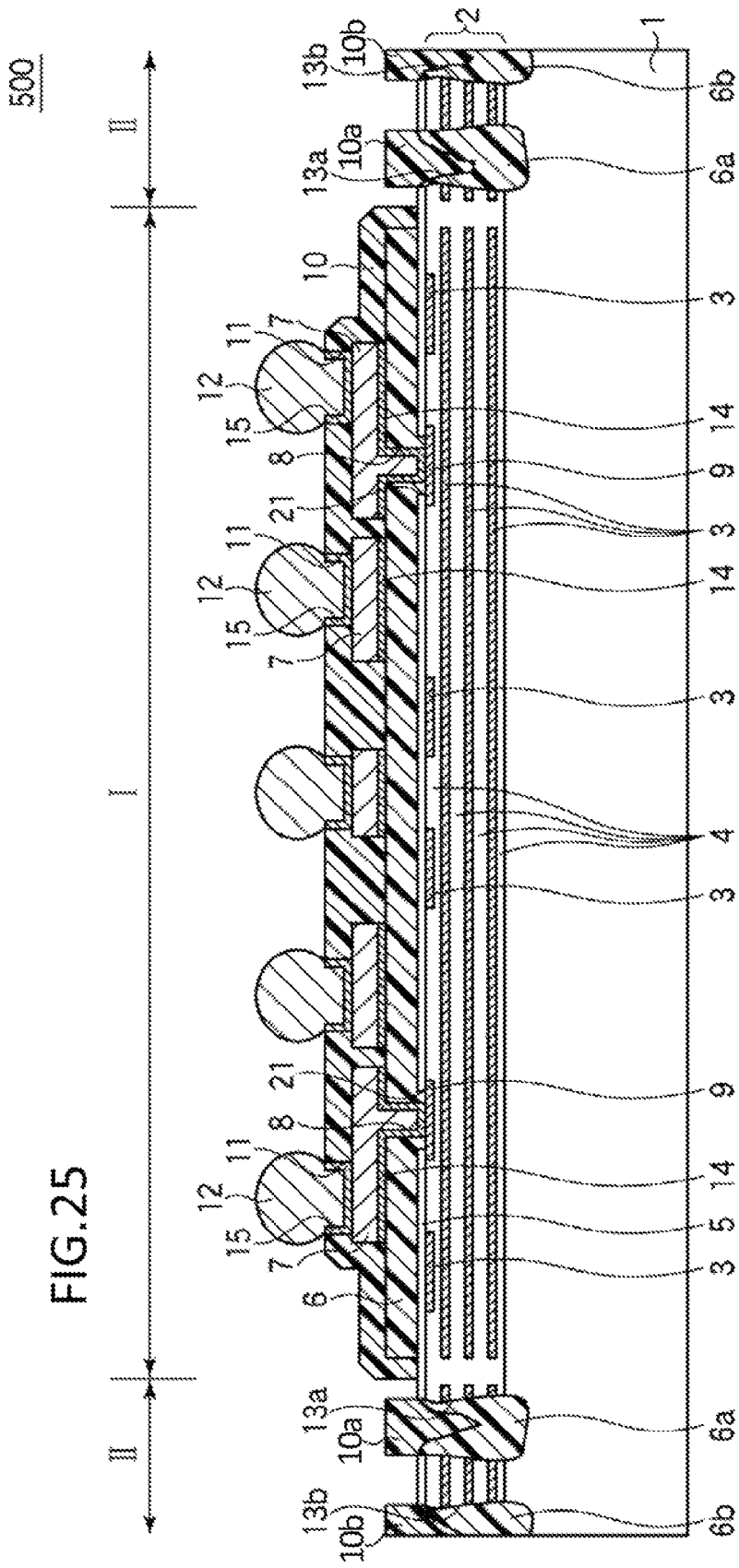

US 8,324,714 B2

SEMICONDUCTOR DEVICE AND METHOD FOR MAKING THE SAME

CROSS REFERENCE TO RELATED APPLICATION

This application is based upon and claims the benefit of priority from the prior Japanese Patent Application NO. 2009-273148 filed on Dec. 1, 2009, the entire contents of which are incorporated herein by reference.

FIELD

The embodiments discussed herein are related to a semiconductor device and a method for making the same.

BACKGROUND

In a process of manufacturing a semiconductor device such as a semiconductor integrated circuit device, a plurality of semiconductor elements (semiconductor chips) are formed on one of the main surfaces of a semiconductor substrate such as a silicon (Si) substrate by applying what is known as wafer processing.

Each semiconductor element includes functional elements, e.g., active elements such as transistors and passive elements such as capacitors, and wiring conductors. The wiring conductors interconnect the functional elements to form a desired electronic circuit.

After formation of the semiconductor elements, the semiconductor substrate is diced along scribe regions to separate the semiconductor elements into individual pieces (singulation).

In order to comply with the recent demand for higher function, faster operation electronic appliances, semiconductor devices mounted in such electronic appliances are desired to achieve higher integration and faster operation.

In other words, functional elements such as active elements and passive elements of semiconductor elements constituting semiconductor devices are increasingly miniaturized to achieve higher integration.

In order to speed up the operation, a material mainly composed of copper (Cu) is being used as a material for wiring layers interconnecting the functional elements, and an insulating material having a low dielectric coefficient (a.k.a. low-k material) is used as a material for dielectric layers (interlayer insulating layers) that insulate between the wiring layers.

However, multilevel wiring structures that use a low-k insulating material as the insulating material between wiring layers, i.e., interlayer insulating material, are susceptible to mechanical damage during dicing and thus prone to cracking and/or delamination.

In other words, when a substrate is diced using a dicing blade, rotation of the dicing blade mechanically damages the low-k insulating material layers and tends to cause cracking and/or delamination.

Cracking and/or delamination of the insulating material layers allows moisture penetration and is thus one of the factors that deteriorate the reliability of semiconductor elements.

In this regard, for example, Japanese Laid-open Patent Publication No. 2007-329396 proposes a structure in which a groove is formed between a scribe region and a region where electronic circuits are formed (hereinafter this region is referred to as "circuit region"). This groove surrounds the circuit region, penetrates a multilevel wiring structure that uses an insulating material having a low dielectric constant (low-k insulating material) as the interlayer insulating material, and is filled with an organic insulating material extending from the circuit region.

This groove substantially extends the path through which moisture penetrates into the circuit region.

Japanese Laid-open Patent Publication Nos. 2008-130880 and 2008-166352 also propose structures similar to the aforementioned patent publication.

The groove formed in a multilevel wiring structure that uses a low-k insulating material as the insulating material between wiring layers, i.e., interlayer insulating material, is formed by laser beam irradiation, for example.

Dicing using a dicing blade is performed at the scribe region at the outer side of the groove, i.e., at the side opposite to the circuit region.

That is, the low-k insulating material layers and the underlying semiconductor substrate of the multilevel wiring structure are subject to mechanical dicing in the scribe region.

Thus, even when the structure disclosed in these patent documents is employed, delamination of the low-k insulating material layers having a relatively narrow width and lying between the grooves and the diced part and/or fracture of the semiconductor substrate under the low-k insulating material layers may occur.

According to the structure disclosed in the patent documents, the organic insulating material filling the groove extends from the region where semiconductor elements are formed.

Thus, moisture may penetrate into the region where the semiconductor elements are formed through the interface between the organic insulating material and the low-k insulating material layers.

SUMMARY

According to an aspect of an embodiment, a semiconductor device that includes a semiconductor substrate having a main surface in which a semiconductor element region where a plurality of functional elements are formed; a multilevel wiring layer disposed on the main surface of the semiconductor substrate; a first organic insulating material layer disposed on the multilevel wiring layer; a groove that penetrates the multilevel wiring layer on a scribe region that surrounds the semiconductor element region; and an organic insulating material that is spaced from the first organic insulating material layer and disposed in the groove.

According to another aspect of the embodiment, a method for making a semiconductor device, the method including a step of forming functional elements in each of a plurality of semiconductor element regions on a main surface of a semiconductor substrate; a step of forming a multilevel wiring layer on the main surface of the semiconductor substrate; a step of forming a groove in the multilevel wiring layer on a scribe region around each semiconductor element region so that the groove surrounds the semiconductor element region and penetrates the multilevel wiring layer; a step of forming an organic insulating material layer on the multilevel wiring layer and in the groove; a step of separating the organic insulating material layer covering the multilevel wiring layer on the semiconductor element region from the organic insulating material disposed in the groove; and a step of cutting the semiconductor substrate at the scribe region.

The object and advantages of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF DRAWINGS

FIG. 2 is a cross-sectional view depicting a structure of the semiconductor device according to the first embodiment;

FIGS. 3A and 3B are cross-sectional views (No. 1) depicting the steps of a method for making the semiconductor device according to the first embodiment;

FIGS. 4A and 4B are cross-sectional views (No. 2) depicting the steps of a method for making the semiconductor device according to the first embodiment;

FIGS. 5A and 5B are cross-sectional views (No. 3) depicting the steps of a method for making the semiconductor device according to the first embodiment;

FIGS. 6A and 6B are cross-sectional views (No. 4) depicting the steps of a method for making the semiconductor device according to the first embodiment;

FIGS. 7A and 7B are cross-sectional views (No. 5) depicting the steps of a method for making the semiconductor device according to the first embodiment;

FIGS. 8A and 8B are cross-sectional views (No. 6) depicting the steps of a method for making the semiconductor device according to the first embodiment;

FIGS. 9A and 9B are cross-sectional views (No. 7) depicting the steps of a method for making the semiconductor device according to the first embodiment;

FIGS. 10A and 10B are cross-sectional views (No. 8) depicting the steps of a method for making the semiconductor device according to the first embodiment;

FIGS. 12A and 12B are cross-sectional views (No. 1) depicting the steps of a method for making the semiconductor device according to the second embodiment;

FIGS. 13A and 13B are cross-sectional views (No. 2) depicting the steps of a method for making the semiconductor device according to the second embodiment;

FIGS. 14A and 14B are cross-sectional views (No. 3) depicting the steps of a method for making the semiconductor device according to the second embodiment;

FIGS. 15A and 15B are cross-sectional views (No. 4) depicting the steps of a method for making the semiconductor device according to the second embodiment;

FIGS. 19A and 19B are cross-sectional views (No. 3) depicting the steps of a method for making the semiconductor device according to the third embodiment;

FIGS. 20A and 20B are cross-sectional views (No. 4) depicting the steps of a method for making the semiconductor device according to the third embodiment;

FIG. 21 is a cross-sectional view depicting a structure of the semiconductor device according to a fourth embodiment;

FIGS. 23A and 23B are cross-sectional views (No. 2) depicting the steps of a method for making the semiconductor device according to the fourth embodiment;

FIGS. 24A and 24B are cross-sectional views (No. 3) depicting the steps of a method for making the semiconductor device according to the fourth embodiment; and FIG. 25 is a cross-sectional view depicting a structure of the semiconductor device according to a fifth embodiment.

DESCRIPTION OF EMBODIMENTS

First Embodiment

A semiconductor device according to a first embodiment will now be described as well as a method for making the semiconductor device.
<Semiconductor Device>

Figure 1:
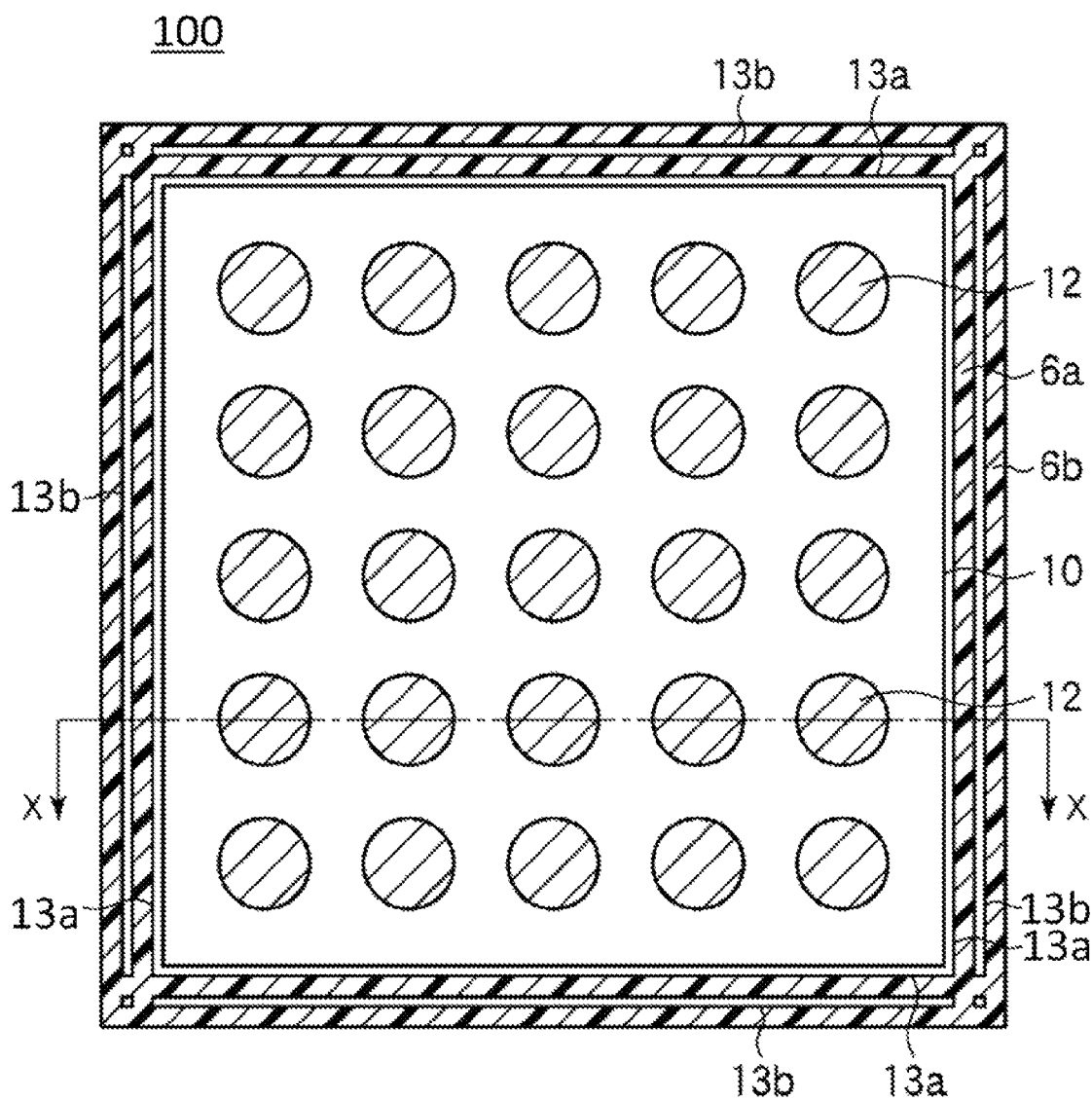
FIG. 1 is a plan view depicting a structure of a semiconductor device according to a first embodiment.

A semiconductor device 100 of the first embodiment is depicted in FIGS. 1 and 2.

FIG. 1 depicts a surface of the semiconductor device 100 on which terminals for external connection are provided. FIG. 2 is a cross-sectional view taken along line X-X in FIG. 1.

Although not depicted in the drawing, active elements such as transistors and passive elements such as resistors and capacitors are formed in a semiconductor element region (electronic circuit region) I on one (upper surface) of main surfaces of a semiconductor substrate 1 of the semiconductor device 100.

The functional elements such as the active and passive elements are interconnected through a multilevel wiring layer 2 on the semiconductor substrate 1 to form an electronic circuit (not depicted) such as a logic circuit, an amplifier circuit, or a memory circuit.

Silicon (Si) or gallium arsenide (GaAs) is used in the semiconductor substrate 1. The functional elements are formed by wafer processing near one (upper surface) of the main surfaces of the semiconductor substrate 1.

The functional elements are interconnected through the multilevel wiring layer 2 on the main surface of the semiconductor substrate 1.

The multilevel wiring layer 2 includes wiring layers 3 composed of a conductor mainly composed of copper (Cu) or aluminum (Al) and interlayer insulating layers 4 interposed between the wiring layers 3 and composed of an organic insulating material or an inorganic insulating material. The thickness of the multilevel wiring layer 2 is about 10 μm, although this depends on the number of the wiring layers included therein.

In FIG. 2, each wiring layer 3 is depicted as one continuous linear member but the wiring layer 3 is actually divided into a power supply line, a ground line, a signal line, etc., on the insulating layer and is extended and arranged in accordance with the positions of the functional elements, although this is not depicted in the drawing.

In order to increase the speed of electric signals flowing in the wiring layers, the multilevel wiring layer 2 is mainly constituted by wiring layers 3 which are conductive layers mainly composed of copper (Cu) and low-k interlayer insulating layers 4 which are organic insulating material layers.

The insulating material constituting the low-k interlayer insulating layers 4 is a dielectric material having a relative dielectric constant of about 2.0 to 4.0, and SiOC, SiOCH, or the like is suitable as such an insulating material.

A porous insulating material or a low-k inorganic insulating material may be used as the insulating material constituting the low-k interlayer insulating layers 4.

The wiring layers 3 that are stacked are selectively interconnected through conductive plugs composed of substantially the same material as the wiring layer material, and the functional elements and the wiring layers are also interconnected with conductive plugs, although this is not depicted in the drawing.

A surface protection layer (passivation layer) 5 formed of, for example, a silicon nitride (SiN) film is disposed on the multilevel wiring layer 2, an organic insulating material layer 6 is disposed on the surface protection layer 5, and a re-wiring layer 7 is disposed on the organic insulating material layer 6.

The re-wiring layer 7 is connected to electrode pads 9, which are disposed in a surface portion of the multilevel wiring layer 2, through openings 8 formed in the organic insulating material layer 6.

Another organic insulating material layer 10 is disposed to cover the re-wiring layer 7. Terminals 12 for external connection are disposed on the organic insulating material layer 10 and are connected to the re-wiring layer 7 through openings 11 formed in the organic insulating material layer 10.

The organic insulating material layers 6 and 10 each have a thickness of about 4 to 8 μm and are composed of photosensitive polyimide. The organic insulating material layer 10 covers the end portions of the organic insulating material layer 6 at the periphery of the semiconductor element region I.

The terminals 12 for external connection are constituted by bump-shaped solder balls having a height of about 50 to 150 μm.

In the first embodiment, the organic insulating material layers 6 and 10 are on the surface protection layer 5 and do not extend to the peripheral end portion of the semiconductor device 100, i.e., a scribe region II.

In other words, the scribe region II around the semiconductor element region I covered with the organic insulating material layers is not covered with the organic insulating material layers 6 and 10. The surface protection layer 5 covering the extended part of the multilevel wiring layer 2 including the low-k interlayer insulating layers 4 remains uncovered in the scribe region II.

Two grooves 13 (13a and 13b) that penetrate the surface protection layer 5 and the low-k interlayer insulating layers 4 and have a depth reaching the semiconductor substrate 1 are formed in the scribe region II.

The grooves 13 are filled with an organic insulating material.

The first groove 13a on the inner side, i.e., on the semiconductor element region I side, is spaced from the semiconductor element region I and surrounds the periphery of the semiconductor element region I.

The first groove 13a has a width of about 5 to 15 μm and a depth of about 20 to 30 μm, penetrates the multilevel wiring layer 2, and reaches the semiconductor substrate 1.

The first groove 13a is filled with an organic insulating material 6a composed of a photosensitive polyimide.

The second groove 13b is located on the outer side of the first groove 13a, i.e., more spaced from the semiconductor element region I, and surrounds the periphery of the semiconductor element region I. Part of the second groove 13b is integral with the side surfaces of the semiconductor substrate 1.

The second groove 13b is filled with an organic insulating material 6b composed of photosensitive polyimide, and the organic insulating material 6b is exposed in the side surface of the semiconductor substrate 1.

In other words, the second groove 13b and the organic insulating material 6b filling the second groove 13b are partly exposed in the side surface of the semiconductor device 100.

As with the first groove 13a, the second groove 13b also has a depth of about 20 to 30 μm, penetrates the multilevel wiring layer 2, and reaches the semiconductor substrate 1. Since part of the second groove 13b is integral with the side surface of the semiconductor device 100, the width thereof (width in a direction perpendicular to the periphery of the semiconductor device 100) is smaller than the width of the first groove 13a.

The upper surfaces of the organic insulating materials 6a and 6b are substantially flush with the upper surface of the surface protection layer 5.

In other words, two grooves 13a and 13b that penetrate the interlayer insulating layers 4 of the multilevel wiring layer 2 and reach the semiconductor substrate 1 surround the semiconductor element region I of the semiconductor device 100 of the first embodiment, and the grooves 13a and 13b are respectively filled with the organic insulating materials 6a and 6b.

The organic insulating materials 6a and 6b respectively filling the grooves 13a and 13b are spaced from the organic insulating material layer 10 in the semiconductor element region I.

Accordingly, the creeping distance of the semiconductor substrate surface from the side surface or end portion of the semiconductor device 100 to the semiconductor element region I becomes large. Moreover, since the interface between the organic insulating materials 6a and 6b filling the grooves 13a and 13b and the organic insulating material layer 10 is not continuous, penetration of moisture from the side surface or end portion of the semiconductor device 100 into the semiconductor element region I may be effectively prevented or suppressed.

The first groove 13a and the second groove 13b are continuous with each other in four corner portions of the semiconductor device 100 owing to the process of making these grooves.

However, the continuous portions are limited to a width corresponding to the width of the grooves 13a and 13b and the possibility of moisture penetration from the continuous portions is very low.

Since there are two grooves 13a and 13b that surround the semiconductor element region I, penetrate the multilevel wiring layer 2, and have a depth reaching down to the semiconductor substrate 1 and the grooves 13a and 13b are respectively filled with the organic insulating materials 6a and 6b, the mechanical stresses applied to the semiconductor element region I during dicing are eliminated or reduced.

Accordingly, delamination of the low-k interlayer insulating layers 4 forming the multilevel wiring structure in the semiconductor element region I or the like may be prevented.

Since two grooves 13a and 13b surround the semiconductor element region I, the scribe region II subject to dicing is easily identifiable.

The number of the grooves surrounding the semiconductor element region I is not limited to two as in the first embodiment.

Forming one groove that surrounds the semiconductor element region I, penetrates the multilevel wiring layer 2, and has a depth reaching to the semiconductor substrate 1 will also separate the interlayer insulating layers 4 between the side surface or end portion of the semiconductor device 100.

Then the organic insulating materials 6a and 6b are charged in the grooves 13a and 13b by being spaced from the organic insulating material layer 10 in the semiconductor element region I.

As a result, the mechanical stresses applied to the semiconductor element region I during dicing may be eliminated or reduced and penetration of moisture into the semiconductor element region I may be prevented or suppressed.

Naturally, the technical idea of this embodiment poses no limitation on the number of the grooves and three or more grooves may be provided.

<Method for Making Semiconductor Device>

A method for making the semiconductor device 100 according to the first embodiment will now be described with reference to FIGS. 3A to 10B.

In FIGS. 3A to 10B, cross-sections of two semiconductor element regions I and one scribe region II interposed between the semiconductor element regions II in a semiconductor substrate 1 are depicted.

That is, in the drawings, a scribe region II and part of two semiconductor element regions I-A and I-B at both sides of the scribe region II are depicted.

In FIGS. 3A to 10B, each wiring layer 3 is also depicted as one continuous linear member. However, the wiring layer 3 is actually divided into a power supply line, a ground line, a signal line, etc., in each semiconductor element region I, and is extended and arranged in accordance with the positions of the functional elements.

Moreover, the wiring layers are interconnected through interlayer connecting portions not depicted in the drawings.

Although not depicted in the drawing, active elements such as transistors and passive elements such as resistors and capacitors are formed in the semiconductor element regions (electronic circuit region) I on one (upper surface) of main surfaces of the semiconductor substrate 1 by wafer processing.

The functional elements such as the active and passive elements are interconnected through the multilevel wiring layer 2 on the semiconductor substrate 1 to form an electronic circuit (not depicted) such as a logic circuit, an amplifier circuit, or a memory circuit.

In order to increase the speed of electric signals flowing in the conductive layers, the multilevel wiring layer 2 is mainly constituted by the wiring layers 3 which are conductive layers mainly composed of copper (Cu) and the low-k interlayer insulating layers 4 which are organic insulating layers.

The insulating material constituting the low-k interlayer insulating layers 4 is a dielectric material having a relative dielectric constant of about 2.0 to 4.0, and SiOC, SiOCH, or the like is suitable as such an insulating material.

A porous insulating material or a low-k inorganic insulating material may be used as the insulating material constituting the low-k interlayer insulating layers 4.

The wiring layers 3 that are stacked are selectively interconnected through conductive plugs composed of substantially the same material as the wiring layer material, and the functional elements and the wiring layers are also interconnected with conductive plugs, although this is not depicted in the drawing.

Then the surface protection layer 5 composed of an inorganic insulating material is formed on the multilevel wiring layer 2 by, for example, a chemical vapor deposition (CVD) technique.

The surface protection layer 5 is, for example, a silicon nitride (SiN) film having a thickness of about 1 μm.

Subsequently, openings 21 exposing the electrode pads 9 in the uppermost layer of the multilevel wiring layer 2 is formed in the surface protection layer 5 (see FIG. 3A).

This step is usually included in the wafer processing.

In the first embodiment, a photoresist layer 31 is formed on the surface protection layer 5 having the holes 21 (refer to FIG. 3B).

The photoresist layer 31 is formed by spin-coating.

As described below, the photoresist layer 31 prevents deposition of foreign matter onto the semiconductor element regions I or the like in forming grooves by laser beam irradiation.

In the first embodiment, next, grooves 13 (13a and 13b) are formed in the multilevel wiring layer 2 in the scribe region II by selective laser-beam irradiation (not depicted).

The two end portions of the scribe region II in the width direction are irradiated with the laser beam so that two linear lanes of irradiated portions are formed along each of the semiconductor element regions I.

In particular, the laser beam is applied onto one of the main surfaces of the semiconductor substrate 1 so as to form linear irradiated portions in the two end portions of each scribe region II in the width direction and along the semiconductor element regions I that are arranged in horizontal columns (X direction) and vertical rows (Y direction).

The grooves 13a and 13b formed by the laser beam penetrate the surface protection layer 5 and the multilevel wiring layer 2 and have a depth that reaches the semiconductor substrate 1.

The depth of the grooves varies with the thickness of the multilevel wiring layer 2 but is more than 20 μm.

The width of each groove 13 is 15 μm or less, for example, about 7 μm.

During the laser beam irradiation, the parts constituting the surface protection layer 5, the parts constituting the multilevel wiring layer 2, and the like melt and scatter, land on the surface of the photoresist layer 31, and are affixed thereon.

Then the photoresist layer 31 is removed. As a result, the state in which grooves 13 (13a and 13b) are formed in the multilevel wiring layer 2 in the scribe region II is obtained (refer to FIG. 4A).

In other words, each semiconductor element region I is surrounded by two grooves 13a and 13b.

In forming the grooves 13a and 13b, the scattered substances that had landed on the surface of the photoresist layer 31 are removed along with the photoresist layer 31.

In the first embodiment, an organic insulating material layer 6 is formed in the grooves 13 (13a and 13b) and on the surface protection layer 5 having the holes 21.

In other words, the organic insulating material layer 6 covers the semiconductor element regions I and the scribe region II.

The organic insulating material layer 6 is formed by spin-coating.

The organic insulating material layer 6 is composed of a positive type photosensitive polyimide, has a thickness of 4 μm to 8 μm on the surface protection layer 5, and fills the grooves 13a and 13b (refer to FIG. 4B).

Next, an exposure mask 41 is placed above the organic insulating material layer 6.

The mask layer in the exposure mask 41 has an opening 41a that corresponds to the scribe region II and openings 41b that correspond to the electrode pads 9 in the semiconductor element regions I.

Although only the mask layer in the exposure mask 41 is illustrated in the drawing, the mask layer is disposed on and supported by a surface of a transparent substrate (not depicted).

The organic insulating material layer 6 is then exposed through the exposure mask 41 (refer to FIG. 5A).

Upon completion of the exposure, development is performed to selectively remove the organic insulating material layer 6 on the scribe region II and to form openings 8 that correspond to the electrode pads 9 in the semiconductor element regions I.

Although the organic insulating material layer 6 on the scribe region II is removed, the organic insulating materials 6a and 6b filling the grooves 13a and 13b in the scribe region II remain unremoved (refer to FIG. 5B).

the organic insulating materials 6a and 6b filling the grooves 13a and 13b remain because the intensity of the light applied to the grooves 13a and 13b is low and is not enough for sufficient exposure.

In other words, in order to have the organic insulating materials 6a and 6b unremoved in the grooves 13a and 13b, the thickness of the organic insulating material layer 6 on the surface protection layer 5, the thickness of the multilevel wiring structure portion exposed, exposure dosage, and the like are adjusted.

Subsequently, a titanium (Ti) layer that covers the surface protection layer 5, the exposed multilevel wiring layer 2, and the exposed organic insulating material layer 6 is formed.

The titanium (Ti) layer is formed by sputtering and has a thickness of about 50 nm to 100 nm.

Then a copper (Cu) layer is formed on the titanium (Ti) layer.

The copper (Cu) layer is formed by sputtering and has a thickness of about 400 nm to 700 nm.

As a result, a metal layer 14 constituted by the copper (Cu) layer/titanium (Ti) layer is formed (refer to FIG. 6A). Then a photoresist layer 32 is formed on the copper (Cu) layer of the metal layer 14.

The photoresist layer 32 is formed by spin-coating.

Openings 33 that include the regions corresponding to the openings 8 in the organic insulating material layer 6 that correspond to the electrode pads 9 in the semiconductor element regions I are formed in the photoresist layer 32.

The openings 33 is formed in the photoresist layer 32 by photolithography.

Illustration of the exposure mask for forming the openings 33 is omitted.

While using the photoresist layer 32 as a mask, a copper (Cu) wiring layer 7 is formed on the copper (Cu) layer not coated with the photoresist layer 32 by electric (electrolytic) plating using the metal layer 14 constituted by the copper (Cu) layer/titanium (Ti) layer as a negative electrode (refer to FIG. 6B).

The copper (Cu) wiring layer 7 is also referred to as "re-wiring layer" and formed to have a thickness of about 3 to 5 µm.

Then the photoresist layer 32 is removed.

Next, while using the copper (Cu) wiring layer (re-wiring layer) 7 as a mask, the metal layer 14 constituted by the copper (Cu) layer/titanium (Ti) layer is removed by etching to isolate each copper (Cu) wiring layer (re-wiring layer) 7 (refer to FIG. 7A).

During the etching, the copper (Cu) wiring layers (re-wiring layers) 7 are also slightly etched. However, since their thickness is sufficiently large compared to the metal layer 14 constituted by the copper (Cu) layer/titanium (Ti) layer, no adverse effect arises.

Subsequently, the second organic insulating material layer 10 that covers the surface protection layer 5, the exposed multilevel wiring layer 2, the exposed organic insulating material layer 6, and the copper (Cu) wiring layer (re-wiring layer) 7 is formed.

The second organic insulating material layer 10 is also composed of a positive type photosensitive polyimide and has a thickness of 4 µm to 8 µm (refer to FIG. 7B).

The second organic insulating material layer 10 is also formed by spin-coating.

The second organic insulating material layer 10 serves as a member that seals the semiconductor element regions I of the semiconductor device 100.

Next, an exposure mask 42 is placed above the second organic insulating material layer 10.

The mask layer in the exposure mask 42 has an opening 42a that corresponds to the scribe region II and openings 42b that correspond to the electrode pads in copper (Cu) wiring layer (re-wiring layer).

Although only the mask layer in the exposure mask 42 is illustrated in the drawing, the mask layer is disposed on and supported by a surface of a transparent substrate (not depicted).

The second organic insulating material layer 10 is then exposed through the exposure mask 42 (refer to FIG. 8A).

Upon completion of the exposure, development is performed to selectively remove the second organic insulating material layer 10 and to form openings 11 on the electrode pads in the copper (Cu) wiring layer (re-wiring layer) 7.

The second organic insulating material layer 10 on the scribe region II is also removed.

At this time, the organic insulating materials 6a and 6b filling the grooves 13a and 13b in the scribe region II remain unremoved.

The organic insulating material layer 10 also remains in the peripheral portion of the semiconductor element region I by covering the end portions of the organic insulating material layer 6 (refer to FIG. 8B).

Subsequently, a titanium (Ti) layer that covers the surface protection layer 5, the exposed multilevel wiring layer 2, the exposed organic insulating material layer 6, the second organic insulating material layer 10, and the copper (Cu) wiring layer (re-wiring layer) 7 is formed.

The titanium (Ti) layer is formed by sputtering and has a thickness of about 50 nm to 100 nm.

Then a copper (Cu) layer is formed on the titanium (Ti) layer.

The copper (Cu) layer is formed by sputtering and has a thickness of about 150 nm to 350 nm.

Next, a nickel (Ni) layer is formed on the copper (Cu) layer.

The nickel (Ni) layer is formed by sputtering and has a thickness of about 5 µm.

In other words, a metal layer 15 constituted by a nickel (Ni) layer/copper (Cu) layer/titanium (Ti) layer multilayer structure is formed (see FIG. 9A).

Then a photoresist layer 34 is formed on the metal layer 15.

Then openings 35 are photolithographically formed to correspond the openings 11 corresponding to the electrode pads of the copper (Cu) wiring layer (re-wiring layer) (refer to FIG. 9B).

The openings 35 are formed in the photoresist layer 34 by photolithography.

Illustration of the exposure mask for forming the openings 35 is omitted.

Next, a solder layer 12s having a relatively large thickness is formed on the metal layer 15 in portions not covered with the photoresist layer 34. The solder layer 12s is formed by electric (electrolytic) plating using the metal layer 15 as a negative electrode (refer to FIG. 9B).

As depicted in the drawing, the solder layer 12s is deposited so that part thereof extends over the photoresist layer 34.

A lead-free solder is used as the solder material constituting the solder layer 12s.

The photoresist layer 34 is removed after the plating.

While using the solder layer 12s as a mask, the exposed metal layer (the nickel (Ni) layer/copper (Cu) layer/titanium (Ti) layer multilayer structure) 15 is selectively removed.

The solder layer 12s is subjected to reflow so that the solder layer 12s forms terminals 12 for external connection and having substantially spherical shapes (see FIG. 10A).

The reflow is conducted by placing the semiconductor substrate 1 in a heating furnace (not depicted) called "reflow furnace".

Then the semiconductor substrate 1 is placed and fixed on a table of a dicing machine and diced into individual pieces (singulation) with a rotating dicing blade 51.

Prior to the dicing, a dicing tape (not depicted) is attached on the rear surface (surface on which no electronic circuits are formed) of the semiconductor substrate 1.

In dicing, the thickness t of the dicing blade 51 is selected to be substantially equal to the center-to-center distance between the outer grooves 13b in the scribe region II, i.e., the two grooves 13b located at the inner side with respect to the center of the scribe region II between the two semiconductor element regions (see FIG. 10B).

Note that in FIG. 10B, the shape of a cross section of a relevant part of the dicing blade 51 is illustrated by a broken line.

The dicing blade 51 cuts the organic insulating materials 6b in the two grooves 13b at the inner side with respect to the center of the scribe region II as well as the semiconductor substrate 1 under the grooves 13b.

The organic insulating material 6b composed of photosensitive polyimide and filling the second groove 13b appears in the peripheral side surface of the semiconductor substrate 1 of the individual semiconductor device 100 obtained by dicing.

In other words, the second groove 13b and the organic insulating material 6b filling the second groove 13b are exposed in the side surface of the semiconductor device 100.

When dicing is conducted in such a manner, the multilevel wiring structure portion including the low-k insulating material in the scribe region II is not cut by the dicing blade 51 and thus delamination of the interlayer insulating layers 4 of the multilevel wiring layer 2 or the like does not occur.

At the time of dicing, there are a total of four grooves 13a and 13b extending parallel to each other in the scribe region II, and the grooves 13a are filled with the organic insulating material 6a and the grooves 13b are filed with the organic insulating material 6b; thus, the scribe region II is easily recognizable, the alignment of the dicing blade 51 may be facilitated, and the accuracy of alignment may be improved.

Although a high pressure is applied by the dicing blade 51 during dicing, the pressure is absorbed or reduced by the organic insulating materials 6a and 6b filling the grooves 13a and 13b. Thus, the high pressure is not applied to the semiconductor element regions I.

The individual semiconductor device 100 produced by dicing has a cross-sectional structure depicted in FIG. 2.

The organic insulating material 6b in the groove 13b at the outer side of the semiconductor element region I and the semiconductor substrate 1 under the organic insulating material 6b are exposed in the peripheral side surface of the semiconductor device 100.

In other words, according to this structure, the multilevel wiring structure portion that includes the low-k insulating material is not exposed in the peripheral side surface of the semiconductor device 100; thus, delamination of the interlayer insulating layers 4 in the multilevel wiring structure portion or the like does not occur.

Moreover, according to this structure, the creeping distance from the peripheral side surface of the semiconductor device to the semiconductor element region is increased, and moisture penetration into the semiconductor element region may be effectively prevented.

Second Embodiment

A semiconductor device according to a second embodiment will now be described as well as a method for making the semiconductor device.

<Semiconductor Device>

Figure 11:
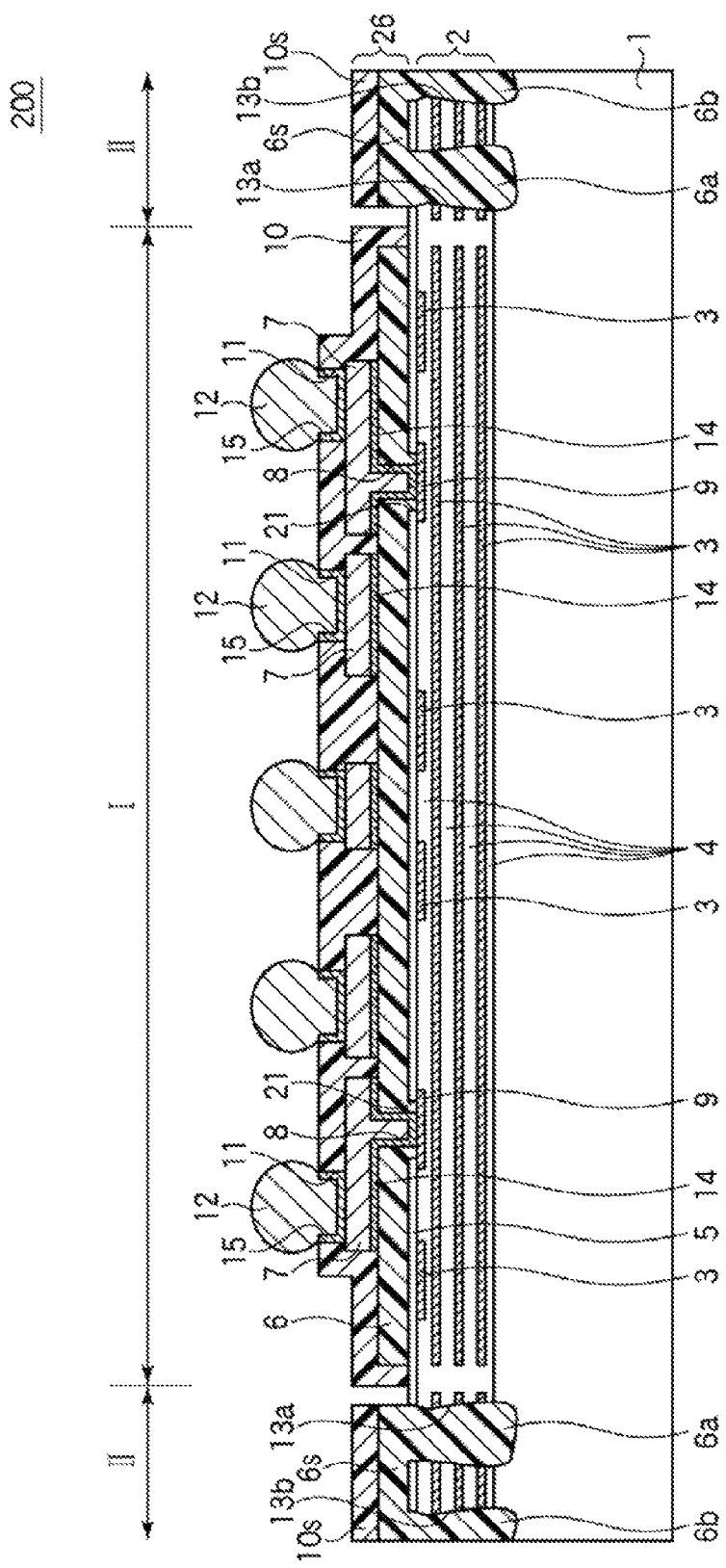
FIG. 11 is a cross-sectional view depicting a structure of the semiconductor device according to the second embodiment.

A semiconductor device 200 of the second embodiment is depicted in FIG. 11. FIG. 11 is a cross-sectional view of a portion equivalent to the portion depicted in FIG. 2.

As depicted in the drawing, in the semiconductor device 200 also, wiring layers 3 are each depicted as one continuous linear member. However, each wiring layer 3 is actually divided into a power supply line, a ground line, a signal line, etc., on the insulating layer in the semiconductor element region I, and is extended and arranged in accordance with the positions of the functional elements.

Moreover, the wiring layers are interconnected through interlayer connecting portions not depicted in the drawings.

The semiconductor device 200 according to the second embodiment differs from the semiconductor device 100 of the first embodiment in the arrangement of the organic insulating materials disposed in the grooves surrounding the semiconductor element region I.

Thus, parts of the semiconductor device 200 of the second embodiment corresponding to the parts of the semiconductor device 100 of the first embodiment are represented by the same reference symbols and the descriptions therefor are omitted to avoid redundancy.

According to the semiconductor device 200 of the second embodiment, a composite organic insulating material layer 26 composed of organic insulating materials stacked on the organic insulating material 6a filling the first groove 13a surrounding the semiconductor element region I and the organic insulating material 6b filling the second groove 13b.

The composite organic insulating material layer 26 overlying the two grooves covers the multilevel wiring layer 2 between the first groove 13a and the second groove 13b. The composite organic insulating material layer 26 has a particular width and a shape of a strip and surrounds the semiconductor element region I.

The composite organic insulating material layer 26 is spaced from the organic insulating material layer 10 on the semiconductor element region I and surrounds the semiconductor element region I.

The composite organic insulating material layer 26 has a side surface continuous with the side surface of the semiconductor substrate 1.

In other words, in the semiconductor device 200 of the second embodiment also, two grooves 13a and 13b that penetrate the multilevel wiring layer 2 and have a depth reaching the semiconductor substrate 1 are formed to surround the semiconductor element region I and the grooves 13a and 13b are filled with an organic insulating material.

The grooves 13a and 13b each penetrate the multilevel wiring layer 2 and reach the semiconductor substrate 1.

As a result, the creeping distance of the semiconductor substrate surface from the side surface or end portion of the semiconductor device 200 to the semiconductor element region I becomes large. Moreover, since the interface between the organic insulating materials 6a and 6b filling the grooves 13a and 13b and the organic insulating material layer 10 is not continuous, penetration of moisture from the side surface or end portion of the device into the semiconductor element region I may be effectively prevented or suppressed.

Since there are two grooves 13 that surround the semiconductor element region I, penetrate the multilevel wiring layer 2, and have a depth reaching down to the semiconductor substrate 1 and the grooves 13a and 13b are respectively filled with the organic insulating materials 6a and 6b, the mechanical stresses applied to the semiconductor element region I during dicing are eliminated or reduced.

Accordingly, delamination of the low-k interlayer insulating layers 4 forming the multilevel wiring structure in the semiconductor element region I or the like may be prevented.

Moreover, because of the presence of the composite organic insulating material layer 26 having a strip shape and spaced from the organic insulating material layer on the semiconductor element region, the scribe region II is easily identifiable.

<Method for Making Semiconductor Device>

A method for making the semiconductor device 200 according to the second embodiment will now be described with reference to FIGS. 12A to 15B.

In the drawings, one scribe region II and part of two semiconductor element regions I-A and I-B at both sides of the scribe region II are depicted.

In the method for making the semiconductor device 200 of the second embodiment, a mask that covers the two grooves 13a and 13b and a portion between the two grooves is used to conduct exposure of the organic insulating material layer 6, as described below.

The steps of forming plural semiconductor element regions I in one of the main surfaces of the semiconductor substrate 1 and forming grooves in a multilayer wiring structure portion in a scribe region II between the semiconductor element regions I are substantially the same as those of the first embodiment and the descriptions therefor are omitted.

Two linear grooves are formed along the periphery of each semiconductor element region I near two end portions of the scribe region II in the width direction.

Then, the organic insulating material layer 6 is formed in the grooves 13a and 13b and over the surface protection layer 5 having the openings 8.

The organic insulating material layer 6 is formed by spin-coating.

The organic insulating material layer 6 is composed of a positive type photosensitive polyimide, fills the grooves 13a and 13b, and has a thickness of 4 μm to 8 μm on the surface protection layer 5.

Next, an exposure mask 43 is placed above the organic insulating material layer 6.

The mask layer in the exposure mask 43 has an opening 43a that corresponds to the scribe region II, openings 43b that each extend across the two grooves and the semiconductor element region I, and openings 43c that correspond to the electrode pads 9 in the semiconductor element regions I.

Although only the mask layer in the exposure mask 43 is illustrated in the drawing, the mask layer is disposed on and supported by a surface of a transparent substrate (not depicted).

The organic insulating material layer 6 is then exposed through the exposure mask 43 (refer to FIG. 12A).

Upon completion of the exposure, development is performed to selectively remove the organic insulating material layer 6. The organic insulating material layer 6 on the scribe region II is also selectively removed.

At this stage, the grooves 13a and 13b are filled with the organic insulating materials 6a and 6b and the organic insulating material layer 6 remains unremoved on the multilevel wiring structure portion between the grooves. The organic insulating materials 6a and 6b and the organic insulating material layer 6 remaining thereon are integral and together form an organic insulating material layer 6s having a strip shape and surrounding the semiconductor element region I.

The organic insulating material layer 6s is spaced from the organic insulating material layer 6 in the semiconductor element region I.

The openings 8 corresponding to the electrode pads 9 are formed in the organic insulating material layer 6 in the semiconductor element regions I (see FIG. 12B).

Subsequently, the copper (Cu) wiring layer (re-wiring layer) 7 is formed on the organic insulating material layer 6 by substantially the same process as in the method of the first embodiment (see FIG. 13A).

Then the second organic insulating material layer 10 that covers the surface protection layer 5, the exposed multilevel wiring structure portion, the exposed organic insulating material layer 6, and the copper (Cu) wiring layer (re-wiring layer) 7 is formed (refer to FIG. 13B) by substantially the same process as in the method of the first embodiment.

The second organic insulating material layer 10 is also composed of a positive type photosensitive polyimide.

Next, an exposure mask 44 is placed above the second organic insulating material layer 10.

The mask layer in the exposure mask 44 has an opening 44a that corresponds to the scribe region II, openings 44b each overlaying the portion between the scribe region and the semiconductor element region I, and openings 44c that correspond to the electrode pads in the copper (Cu) wiring layer (re-wiring layer) 7.

Although only the mask layer in the exposure mask 44 is illustrated in the drawing, the mask layer is disposed on and supported by a surface of a transparent substrate (not depicted).

The second organic insulating material layer 10 is then exposed through the exposure mask 44 (refer to FIG. 14A).

Upon completion of the exposure, development is performed to selectively remove the second organic insulating material layer 10 and to form openings 11 on the electrode pads in the copper (Cu) wiring layer (re-wiring layer) 7.

The second organic insulating material layer 10 on the scribe region II is also selectively removed. The organic insulating material layers 6s each having a strip shape and remaining on the multilevel wiring structure portion between the grooves 13a and 13b in the scribe region II and second organic insulating material layers 10s that respectively remain on the organic insulating material layers 6s remain stacked.

In each of the semiconductor element regions I, the second organic insulating material layer 10 remains and covers the end portions of the organic insulating material layer 6.

The multilayer structure including the organic insulating material layer 6s filling the grooves 13a and 13b and the organic insulating material layer 10s in the scribing region is spaced from the second organic insulating material layer 10 in the semiconductor element region I (see FIG. 14B).

Subsequently, the metal layer 15 which is a nickel (Ni) layer/copper (Cu) layer/titanium (Ti) layer multilayer structure is formed to cover the surface protection layer 5, the exposed multilevel wiring structure portion, the exposed organic insulating material layer 6, the second organic insulating material layer 10, and the copper (Cu) wiring layer (re-wiring layer) 7.

Then a relatively thick solder layer 12s is deposited on the metal layer 15 by electric plating (electrolytic plating). The solder layer 12s is composed of a lead-free solder.

The solder layer 12s is subjected to reflow so that the solder layer 12s forms terminals 12 for external connection and having substantially spherical shapes (see FIG. 15A).

Then the semiconductor substrate 1 is diced into individual pieces (singulation) with the dicing blade 51.

In dicing, the thickness t of the dicing blade 51 is selected to be substantially equal to the center-to-center distance between the outer grooves 13b of the semiconductor device 200, i.e., the two grooves 13b located at the inner side with respect to the center of the scribe region II between the two semiconductor element regions I (see FIG. 15B).

Note that in FIG. 15B, the shape of a cross section of a relevant part of the dicing blade 51 is illustrated by a broken line.

The dicing blade 51 cuts the organic insulating material layers 26 each constituted by an organic insulating material 6s and an organic insulating material layer 10s, the organic insulating material layers 6b in the two grooves 13b at the inner side with respect to the center of the scribe region II, and the semiconductor substrate 1 under the grooves 13b.

The multilayer portion constituted by the organic insulating material 6b composed of photosensitive polyimide and filling the second groove 13b and the organic insulating material layer 10s appears in the peripheral side surface of the semiconductor substrate 1 of the individual semiconductor device 200 obtained by dicing.

In other words, the second groove 13b and the composite organic insulating material layer 26 constituted by the organic insulating material 6b filling the second groove 13b and the organic insulating material layer 10s is exposed in the side surface of the semiconductor device 200.

Here, the multilevel wiring structure portion including the low-k insulating material in the scribe region II is not cut by the dicing blade 51 and thus delamination or the like of the interlayer insulating layers 4 in the multilevel wiring structure portion does not occur.

At the time of dicing, the organic insulating material layers 26 having a strip shape is present in the scribe region Ii of the semiconductor substrate 1. Thus, the scribe region II is easily identifiable, the alignment of the dicing blade 51 may be facilitated, and the accuracy of alignment may be improved.

Although a high pressure is applied by the dicing blade 51 during dicing, the pressure is absorbed or reduced by the organic insulating materials 6a and 6b filling the grooves 13a and 13b and the composite organic insulating material layers 26 stacked thereon. Thus, the high pressure is not applied to the semiconductor element region I.

The individual semiconductor device 200 produced by dicing has a cross-sectional structure depicted in FIG. 11.

According to this method, the organic insulating materials 6a and 6b filling the two grooves in the scribe region II remain unremoved.

The composite organic insulating material layer 26 that extends on the multilayer wiring structure portion between the two grooves remains on the organic insulating materials 6a and 6b filling the grooves by being integrated with the organic insulating materials 6a and 6b, and has a strip shape surrounding the semiconductor element region.

According to this structure also, the multilevel wiring structure portion that includes the low-k insulating material is not exposed in the peripheral side surface of the semiconductor device during dicing using the dicing blade; thus, delamination of the interlayer insulating layers or the like of the multilevel wiring structure does not occur.

Third Embodiment

A semiconductor device according to a third embodiment will now be described as well as a method for making the semiconductor device.
<Semiconductor Device>

Figure 16:
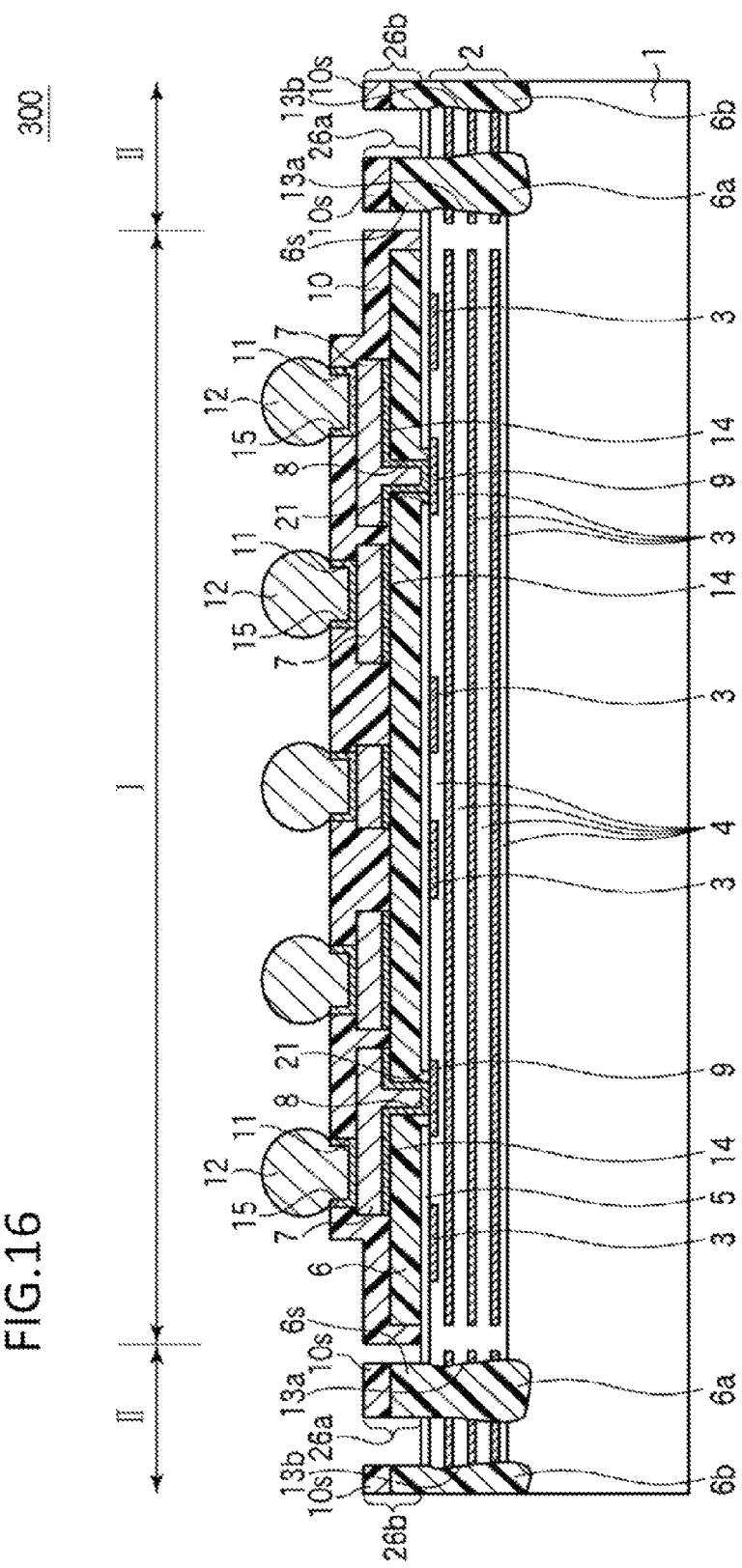
FIG. 16 is a cross-sectional view depicting a structure of the semiconductor device according to a third embodiment.

A semiconductor device 300 of the third embodiment is depicted in FIG. 16. FIG. 16 is a cross-sectional view of a portion equivalent to the portion depicted in FIG. 2.

As depicted in the drawing, in the semiconductor device 300 also, wiring layers 3 are each depicted as one continuous linear member. However, each wiring layer 3 is actually divided into a power supply line, a ground line, a signal line, etc., on the insulating layer in the semiconductor element region I, and is extended and arranged in accordance with the positions of the functional elements.

Moreover, the wiring layers are interconnected through interlayer connecting portions not depicted in the drawings.

The semiconductor device 300 according to the third embodiment differs from the semiconductor device 100 of the first embodiment in the arrangement of the organic insulating material layers disposed in the grooves surrounding the semiconductor element region I.

Thus, parts of the semiconductor device 300 of the third embodiment corresponding to the parts of the semiconductor device 100 of the first embodiment are represented by the same reference symbols and the descriptions therefor are omitted to avoid redundancy.

According to the semiconductor device 300 of the third embodiment, organic insulating material layers 6s and organic insulating material layers 10s are stacked on the organic insulating materials 6a and 6b filling the first groove 13a and the second groove 13b.

Multilayer structures constituted by the organic insulating material layers 6s and the organic insulating material layers 10s disposed on the groove 13a and the groove 13b are each strip-shaped and have a width corresponding to the width of the grooves 13. Two such multilayer structures surround the semiconductor element region I.

In other words, a composite organic insulating material layer 26a disposed on the groove 13a at the semiconductor element region I side is spaced from the organic insulating material layer disposed in the semiconductor element region I and surrounds the semiconductor element region I.

In contrast, a composite organic insulating material layer 26b disposed on the other groove 13b is spaced from the composite organic insulating material layer 26a at the semiconductor element region I side and also surrounds the semiconductor element region I.

The composite organic insulating material layer 26b has a side surface continuous with the side surface of the semiconductor substrate 1.

In other words, two grooves 13a and 13b that penetrate the interlayer insulating layers 4 of the multilevel wiring layer 2 and reach the semiconductor substrate 1 are formed to surround the semiconductor element region I of the semiconductor device 300 of the third embodiment, and the grooves 13a and 13b are respectively filled with the organic insulating materials 6a and 6b.

The grooves 13a and 13b each penetrate the multilevel wiring layer 2 and reach the semiconductor substrate 1.

The grooves 13a and 13b are filled with organic insulating materials 6a and 6b composed of a photosensitive polyimide.

The organic insulating material 6a filling the groove 13a projects from the multilevel wiring layer 2 by a particular height, and the projected part forms the organic insulating material layer 6s. The organic insulating material layer 10s is stacked on the organic insulating material layer 6s to form the composite organic insulating material layer 26a.

The composite organic insulating material layer 26a is spaced from the organic insulating material layer 10 in the semiconductor element region I.

The organic insulating material 6b filling the groove 13b also projects from the multilevel wiring layer 2 by a particular height, and the projected part forms the organic insulating material layer 6s. The composite organic insulating material layer 26b constituted by the organic insulating material layer 6s and the organic insulating material layer 10s is spaced from the composite organic insulating material layer 26a.

As a result, the creeping distance of the semiconductor substrate surface from the side surface or end portion of the semiconductor substrate 1 to the semiconductor element region I becomes large. Moreover, since the interface between the organic insulating material and the interlayer insulating layer is not continuous, penetration of moisture from the side surface or end portion into the semiconductor element region I may be effectively prevented or suppressed.

Since there are two grooves 13a and 13b that surround the semiconductor element region I, penetrate the multilevel wiring layer 2, and have a depth reaching down to the semiconductor substrate 1 and the grooves 13a and 13b are filled with the organic insulating materials 6a and 6b, the mechanical stresses applied to the semiconductor element region I during dicing are eliminated or reduced.

Accordingly, delamination of the low-k interlayer insulating layers 4 forming the multilevel wiring structure in the semiconductor element region I may be prevented.

Moreover, because of the presence of the two organic insulating material layers having a strip shape and spaced from the organic insulating material layer 10 on the semiconductor element region I, the scribe region II is easily identifiable.

<Method for Making Semiconductor Device>

A method for making the semiconductor device 300 according to the third embodiment will now be described with reference to FIGS. 17A to 20B.

In the drawings, a scribe region II and part of two semiconductor element regions I-A and I-B at both sides of the scribe region II are depicted.

In the method for making the semiconductor device 300 of the third embodiment, a mask that exposes the space between two grooves 13a and 13b is placed to conduct exposure of the organic insulating material layer 6, as described below.

The steps of forming semiconductor element regions I in one of the main surfaces of the semiconductor substrate 1 and forming grooves in the multilayer wiring structure portion in the scribe region II between the semiconductor element regions I are the same as those of the first embodiment and the descriptions therefor are omitted.

Two grooves 13 (13a and 13b) are formed along the periphery of each semiconductor element region I near two end portions in the width direction of the scribe region II.

Then, the organic insulating material layer 6 is formed over the grooves 13 and the surface protection layer 5 with the openings 8.

The organic insulating material layer 6 is formed by spin-coating.

The organic insulating material layer 6 is composed of a positive type photosensitive polyimide, fills the grooves 13, and has a thickness of 4 μm to 8 μm on the surface protection layer 5.

Next, an exposure mask 45 is placed above the organic insulating material layer 6.

The mask layer in the exposure mask 45 has an opening 45a that corresponds to the scribe region II, openings 45b that correspond to the portion between the two grooves, openings 45c above the spaces between the grooves and the semiconductor element regions I, and openings 45d that correspond to the electrode pads 9 in the semiconductor element regions I.

Although only the mask layer in the exposure mask 45 is illustrated in the drawing, the mask layer is disposed on and supported by a surface of a transparent substrate (not depicted).

Figure 17A:
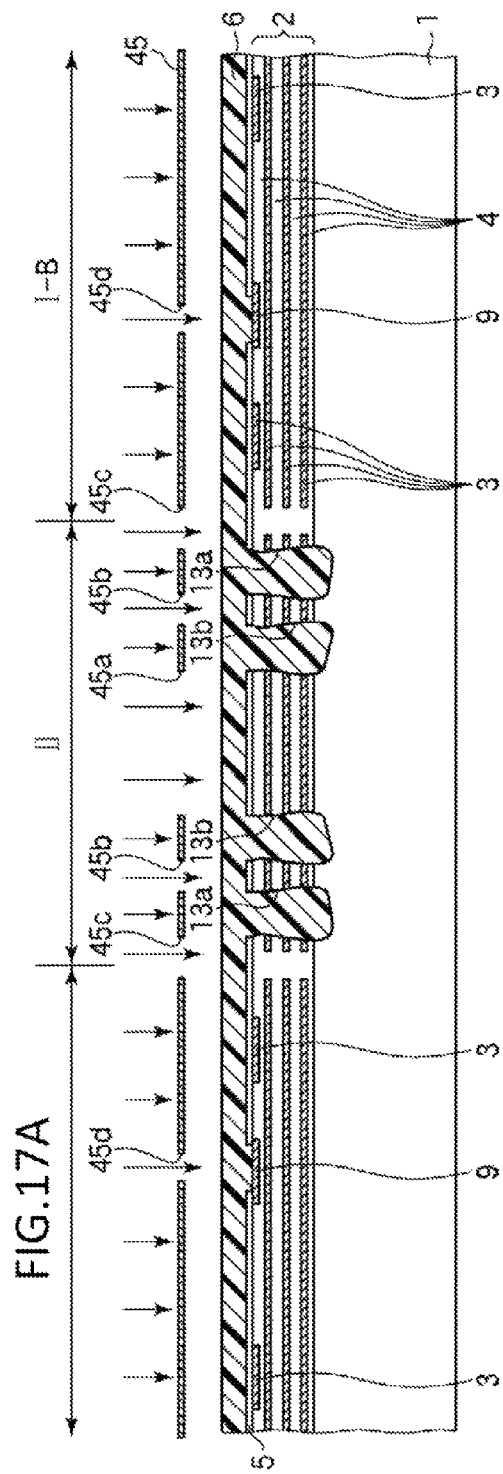
FIGS. 17A and 17B are cross-sectional views (No. 1) depicting the steps of a method for making the semiconductor device according to the third embodiment.

The organic insulating material layer 6 is then exposed through the exposure mask 45 (refer to FIG. 17A).

Upon completion of the exposure, development is performed to selectively remove the organic insulating material layer 6. The organic insulating material layer 6 on the scribe region II is also selectively removed.

At this stage, a portion of the organic insulating material layer 6 filling the grooves 13a and 13b in the scribe region II remains substantially intact, thereby forming two strip-shaped portions on the grooves 13a and 13b, respectively. The strip-shaped portions have a particular height (thickness) from the upper surface of the multilevel wiring layer and surround the semiconductor element region I.

The organic insulating material 6 forming the strip-shaped portions is spaced from the organic insulating material layer 6 covering the semiconductor element region I.

Figure 17B:
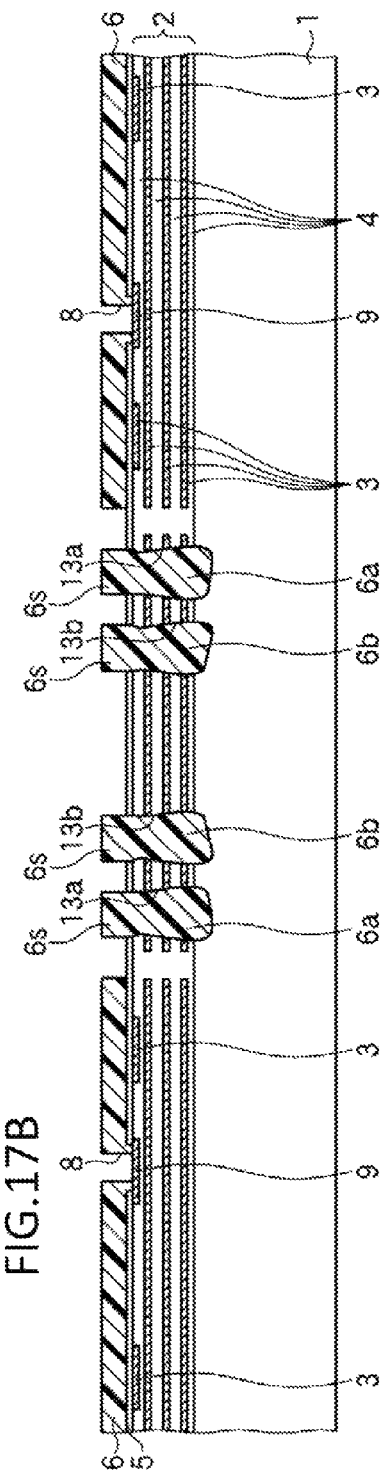

The openings 8 are formed in the organic insulating material layer 6 covering the electrode pads 9 in the semiconductor element regions I (see FIG. 17B).

Figure 18A:
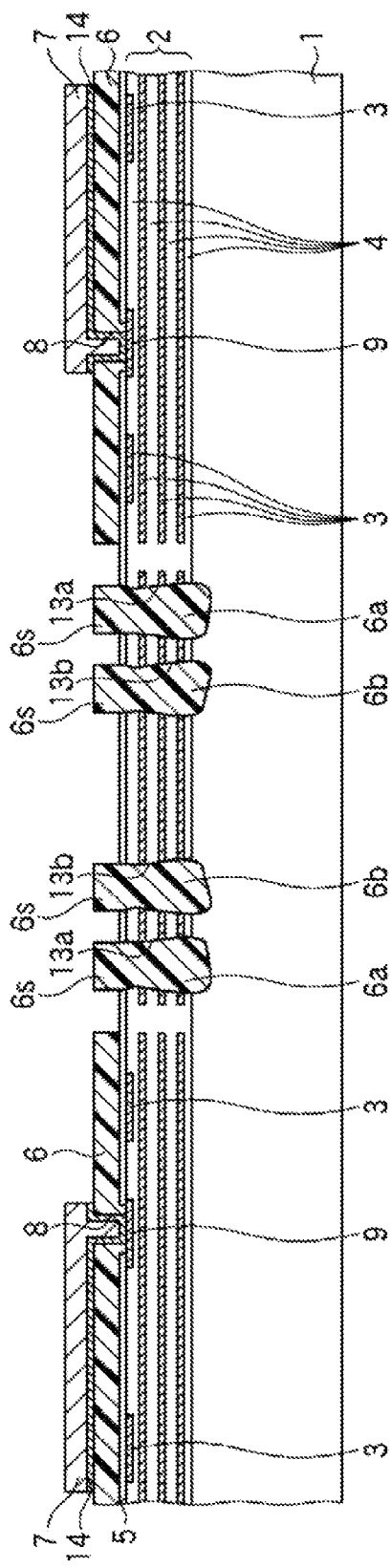
FIGS. 18A and 18B are cross-sectional views (No. 2) depicting the steps of a method for making the semiconductor device according to the third embodiment.
Figure 18B:
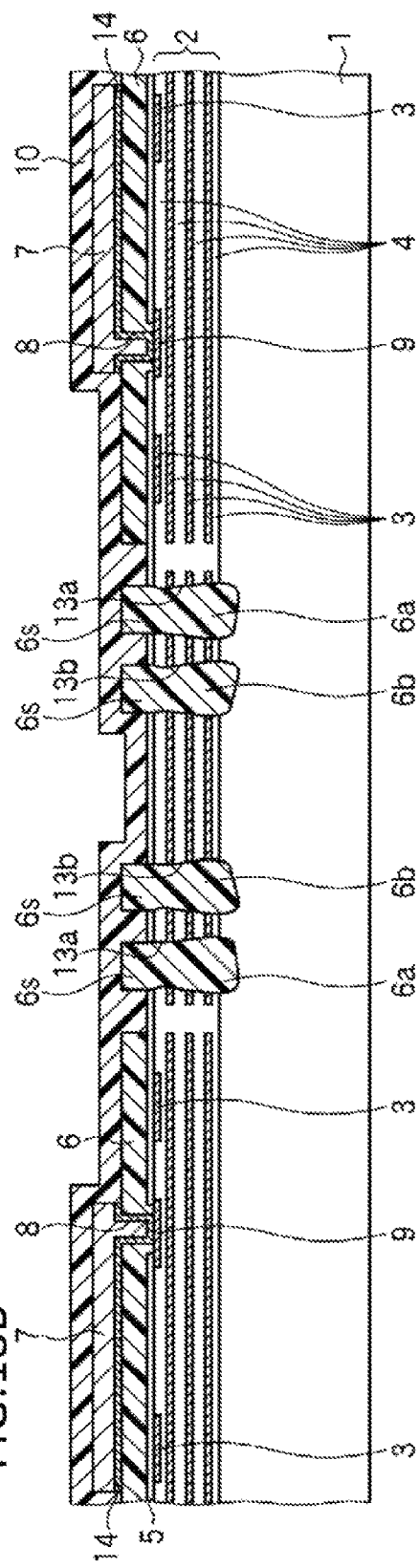

Subsequently, the copper (Cu) wiring layer (re-wiring layer) 7 is selectively formed on the organic insulating material layer 6 by substantially the same process as in the method of the first embodiment (see FIG. 18A).

Then the second organic insulating material layer 10 that covers the surface protection layer 5, the exposed multilevel wiring structure portion, the exposed organic insulating material layer 6, and the copper (Cu) wiring layer (re-wiring layer) 7 is formed (refer to FIG. 18B) by substantially the same process as in the method of the first embodiment.

The second organic insulating material layer 10 is also composed of a positive type photosensitive polyimide.

Next, an exposure mask 46 is placed above the second organic insulating material layer 10.

The mask layer in the exposure mask 46 has an opening 46a that corresponds to the scribe region II, openings 46b that correspond to the portion between the two grooves, openings 46c above the spaces between the grooves and the semiconductor element regions I, and openings 46d that correspond to the electrode pads in the copper (Cu) wiring layer (re-wiring layer) 7.

Although only the mask layer in the exposure mask 46 is illustrated in the drawing, the mask layer is disposed on and supported by a surface of a transparent substrate (not depicted).

The second organic insulating material layer 10 is then exposed through the exposure mask 46 (refer to FIG. 19A).

Upon completion of the exposure, development is performed to selectively remove the second organic insulating material layer 10 and to form openings 11 on the electrode pads in the copper (Cu) wiring layer (re-wiring layer) 7.

Although the organic insulating material layer on the scribe region II is removed, stacks each constituted by the organic insulating material layer 6s, i.e., the upper part of the organic insulating material filling the groove 13, and the second organic insulating material layer 10s on the layer 6s remain in the scribe region II.

In each semiconductor element region I, the second organic insulating material layer 10 covers the end portions of the organic insulating material layer 6.

The second organic insulating material layer 10 in each semiconductor element region I is spaced from a composite organic insulating material layer 26a constituted by the organic insulating material layer 6s covering the groove 13a and the organic insulating material layer 10s in the scribe region II (see FIG. 19B).

Subsequently, a metal layer 15 which is a nickel (Ni) layer/copper (Cu) layer/titanium (Ti) layer multilayer structure is formed to cover the surface protection layer 5, the exposed multilevel wiring structure portion, the exposed organic insulating material layer 6, the second organic insulating material layer 10, and the copper (Cu) wiring layer (re-wiring layer) 7.

Then a relatively thick solder layer 12s is deposited on the metal layer 15 by electric plating (electrolytic plating). The solder layer 12s is composed of a lead-free solder.

The solder layer 12s is subjected to reflow so that the solder layer 12s forms terminals 12 for external connection and having substantially spherical shapes (see FIG. 20A).

Then the semiconductor substrate 1 is diced into individual pieces with a dicing blade 51.

In dicing, the thickness t of the dicing blade 51 is selected to be substantially equal to the center-to-center distance between the outer grooves of the semiconductor device, i.e., the two grooves 13b located at the inner side with respect to the center of the scribe region II between the two semiconductor element regions (see FIG. 20B).

Note that in FIG. 20B, the shape of a cross section of a relevant part of the dicing blade 51 is illustrated by a broken line.

The dicing blade 51 cuts the organic insulating material layers 6b inside the two grooves 13b disposed at the inner side with respect to the center of the scribe region II, the composite organic insulating material layers 26b each constituted by the organic insulating material layer 6s and the second organic insulating material layer 10s, and the semiconductor substrate 1 under the grooves 13b.

The composite organic insulating material layer 26b constituted by the organic insulating material 6b composed of a photosensitive polyimide and filling the second groove 13b and the organic insulating material layer 10s is exposed in the peripheral side surface of the semiconductor substrate 1 of the individual semiconductor device 300 obtained by dicing.

In other words, the second groove 13b and the composite organic insulating material layer 26b constituted by the organic insulating material layer 6b filling the second groove 13b and the second organic insulating material layer 10s is exposed in the side surface of the semiconductor device 300 obtained by dicing.

According to this method, the multilevel wiring structure portion including the low-k insulating material in the scribe region II is not cut by the dicing blade 51 and thus delamination of the interlayer insulating layers 4 of the multilevel wiring structure portion or the like does not occur.

At the time of dicing, there are four strip-shape organic insulating material layers extending parallel to each other in the scribe region II. Thus, the scribe region II is easily recognizable, the alignment of the dicing blade 51 may be facilitated, and the accuracy of alignment may be improved.

Although a high pressure is applied by the dicing blade 51 during dicing, the pressure is absorbed or reduced by the organic insulating material 6b filling the two grooves 13b and the composite organic insulating material layers 26 each constituted by the organic insulating material layer 6s and the second organic insulating material layer 10s. Thus, the high pressure is not applied to the semiconductor element regions I.

The individual semiconductor device 300 produced by dicing has a cross-sectional structure depicted in FIG. 16.

According to this method, the organic insulating material layers filling the two grooves in the scribe region II remain on the multilevel wiring layer 2 by a substantial height (thickness) while filling the grooves.

According to this structure also, the multilevel wiring structure that includes the low-k insulating material is not exposed in the peripheral side surface of the semiconductor device 300 during dicing with the dicing blade 51; thus, delamination of the interlayer insulating layers 4 or the like in the multilevel wiring structure does not occur.

Fourth Embodiment

A semiconductor device according to a fourth embodiment will now be described as well as a method for making the semiconductor device.

<Semiconductor Device>

A semiconductor device 400 of the fourth embodiment is depicted in FIG. 21. FIG. 21 is a cross-sectional view of a portion equivalent to the portion depicted in FIG. 2.

As depicted in the drawing, in the semiconductor device 400 also, wiring layers 3 are each depicted as one continuous linear member. However, each wiring layer 3 is actually divided into a power supply line, a ground line, a signal line, etc., on the insulating layer in the semiconductor element region I, and is extended and arranged in accordance with the positions of the functional elements.

Moreover, the wiring layers are interconnected through interlayer connecting portions not depicted in the drawings.

The semiconductor device 400 according to the fourth embodiment differs from the semiconductor device 100 of the first embodiment in the arrangement of the organic insulating material layers disposed in the grooves surrounding the semiconductor element region I.

Thus, parts of the semiconductor device 400 of the fourth embodiment corresponding to the parts of the semiconductor device 100 of the first embodiment are represented by the same reference symbols and the descriptions therefor are omitted to avoid redundancy.

According to the semiconductor device 400 of the fourth embodiment, the organic insulating material is doubly deposited in the first and second grooves 13a and 13b.

The double organic insulating material layers in the grooves surround the semiconductor element region I.

In other words, the organic insulating material layers doubly deposited in the groove 13a at the semiconductor element region I side are spaced from the organic insulating material layer on the semiconductor element region I and surround the semiconductor element region I.

In contrast, the composite organic insulating material layers doubly deposited in the groove 13b are spaced from the groove 13a and also surround the semiconductor element region I.

The organic insulating material layers have side surfaces continuous with the side surface of the semiconductor substrate 1.

According to the semiconductor device 400 of the fourth embodiment, the organic insulating materials 6a and 6b are buried in the lower part of the grooves 13a and 13b and the organic insulating materials 10a and 10b are buried in the upper part of the grooves 13a and 13b.

In other words, the lower portions of the grooves 13a and 13b are filled with the organic insulating materials 6a and 6b.

The organic insulating materials 6a and 6b are composed of substantially the same material as the organic insulating material layer 6 on the semiconductor element region I.

The grooves 13a and 13b each penetrate the multilevel wiring layer 2 and reach the semiconductor substrate 1.

Recesses 16 in the upper portions of the organic insulating materials 6a and 6b are filled with organic insulating materials 10a and 10b, respectively.

The organic insulating materials 10a and 10b are substantially the same as the organic insulating material constituting the second organic insulating material layer 10 on the semiconductor element region I.

In the fourth embodiment, the reason why the recesses 16 are formed in the upper portions of the organic insulating materials 6a and 6b disposed in the lower parts of the grooves 13 and are filled with the organic insulating materials 10a and 10b is as follows.

That is, during the selective exposure of the organic insulating material layer 6, upper parts of the organic insulating material layers 6 in the grooves 13a and 13b may become exposed depending on the exposure conditions and/or the shape, size, etc., of the grooves, resulting in removal of the upper parts of the organic insulating materials 6 in the grooves and formation of the recesses 16.

In this event, the second organic insulating material layer 10 formed in the later step fills the recesses 16 and the grooves.

Because of this reason, in the fourth embodiment, the lower portions of the grooves 13a and 13b are filled with the organic insulating materials 6a and 6b and the upper portions of the grooves 13a and 13b are filled with the organic insulating materials 10a and 10b filling the recesses 16.

<Method for Making Semiconductor Device>

A method for making the semiconductor device according to the fourth embodiment will now be described with reference to FIGS. 22A to 25B.

In the drawings, the scribe region II and part of two semiconductor element regions I-A and I-B at both sides of the scribe region II are depicted.

In the method for making the semiconductor device 400 of the fourth embodiment, the organic insulating material layer 6 filling the grooves 13a and 13b is subjected to overexposure.

The steps of forming semiconductor element regions I in one of the main surfaces of the semiconductor substrate 1 and forming grooves in the multilayer wiring structure portion in the scribe region II between the semiconductor element regions I are the same as those of the first embodiment and the descriptions therefor are omitted.

Two grooves 13 are formed along the periphery of each semiconductor element region I near two end portions in the width direction of the scribe region II.

Then, the organic insulating material layer 6 is formed over the grooves and the surface protection layer 5 with the holes 20.

The organic insulating material layer 6 is formed by spin-coating.

The organic insulating material layer 6 is composed of a positive type photosensitive polyimide, fills the grooves, and has a thickness of 4 μm to 8 μm on the surface protection layer 5.

Next, an exposure mask 47 is placed above the organic insulating material layer 6.

The mask layer in the exposure mask 47 has an opening 47a that corresponds to the scribe region II and openings 47b that correspond to the electrode pads 9 in the semiconductor element region I.

Although only the mask layer in the exposure mask 47 is illustrated in the drawing, the mask layer is disposed on and supported by a surface of a transparent substrate (not depicted).

Figure 22A:
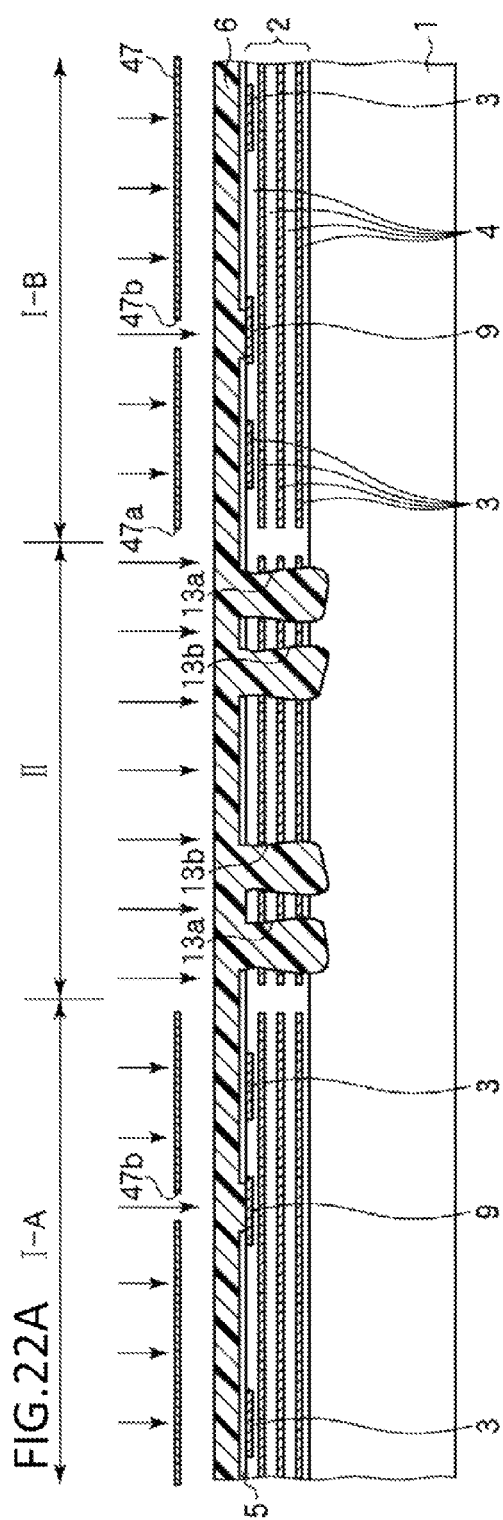
FIGS. 22A and 22B are cross-sectional views (No. 1) depicting the steps of a method for making the semiconductor device according to the fourth embodiment.

The organic insulating material layer 6 is then exposed through the exposure mask 47 (refer to FIG. 22A).

At this stage, at least the organic insulating material layer 6 filling the grooves in the scribe region II is subjected to overexposure.

Upon completion of the exposure, development is performed to selectively remove the organic insulating material layer 6. The organic insulating material layer 6 on the scribe region II is also selectively removed.

At this stage, the organic insulating material layer 6 remains at the bottoms of the grooves 13a and 13b and forms two strip-shaped portions that surround the semiconductor element region I.

Figure 22B:
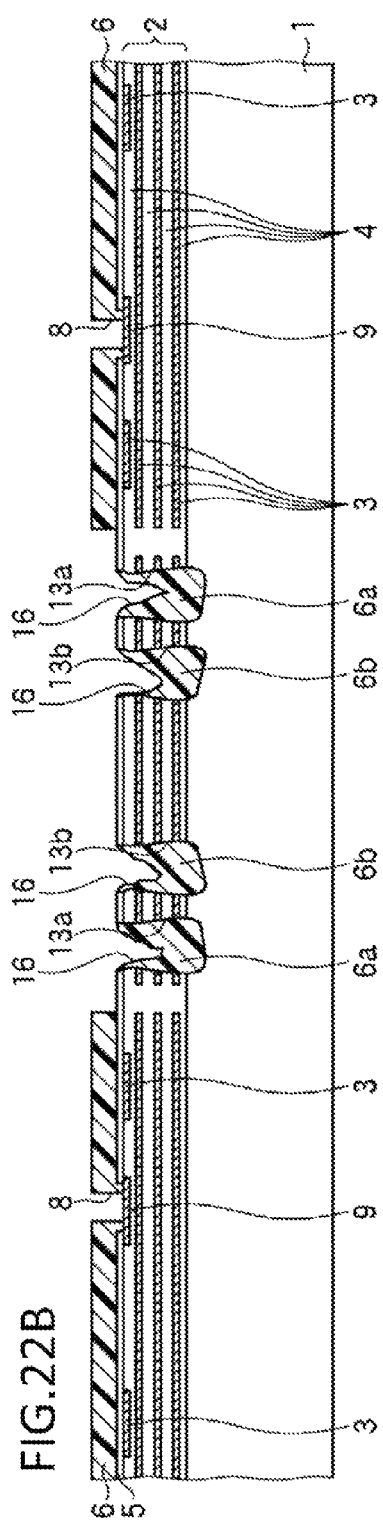

The holes 9 are formed in the organic insulating material layer 6 that covers the electrode pads 9 in the semiconductor element regions I (see FIG. 22B).

The organic insulating material 6a having a strip shape and remaining at the bottom of the groove 13a is spaced form the organic insulating material layer 6 covering the semiconductor element region I.

The recesses 16 are formed in the upper surfaces of the strip-shaped organic insulating materials 6a and 6b remaining in the grooves 13a and 13b, respectively.

The organic insulating material layer 6 remain at the bottom of the grooves by forming a strip shape depending on the shape or size of the grooves 13a and 13b.

Subsequently, the copper (Cu) wiring layer (re-wiring layer) 7 is formed on the organic insulating material layer 6 by substantially the same process as in the method of the first embodiment.

Then the second organic insulating material layer 10 that covers the surface protection layer 5, the exposed multilevel wiring structure portion, the exposed organic insulating material layer 6, and the copper (Cu) wiring layer (re-wiring layer) 7 is formed by substantially the same process as in the method of the first embodiment.

The second organic insulating material layer 10 is also composed of a positive type photosensitive polyimide.

Next, an exposure mask 48 is placed above the second organic insulating material layer 10.

The mask layer in the exposure mask 48 has an opening 48a that corresponds to the scribe region II and openings 48b that correspond to the electrode pads in the copper (Cu) wiring layer (re-wiring layer) 7.

Although only the mask layer in the exposure mask 48 is illustrated in the drawing, the mask layer is disposed on and supported by a surface of a transparent substrate (not depicted).

The second organic insulating material layer 10 is then exposed through the exposure mask 48 (refer to FIG. 23A).

Upon completion of the exposure, development is performed to selectively remove the second organic insulating material layer 10 and to form openings 11 on the electrode pads in the copper (Cu) wiring layer (re-wiring layer) 7.

Although the second organic insulating material layer 10 on the scribe region II is removed, the organic insulating materials 6a and 6b at the bottoms of the grooves 13a and 13b and the second organic insulating materials 10a and 10b on the materials 6a and 6b remain stacked in the scribe region II.

In the semiconductor element region I, the second organic insulating material layer 10 covers the end portions of the organic insulating material layer 6.

The second organic insulating material layer 10 in the semiconductor element region I is spaced from the organic insulating material 10a in the groove 13a in the scribe region II (see FIG. 23B).

Subsequently, the metal layer 15 which is a nickel (Ni) layer/copper (Cu) layer/titanium (Ti) layer multilayer structure is formed to cover the surface protection layer 5, the exposed multilevel wiring structure portion, the exposed organic insulating material layer 6, the second organic insulating material layer 10, and the copper (Cu) wiring layer (re-wiring layer) 7.

Then the relatively thick solder layer 12s is deposited on the metal layer 15 by electric plating (electrolytic plating). The solder layer 12s is composed of a lead-free solder.

The solder layer 12s is subjected to reflow so that the solder layer 12s forms terminals 12 for external connection and having substantially spherical shapes (see FIG. 24A).

Then the semiconductor substrate 1 is diced into individual pieces with a dicing blade 51 (singulation).

In dicing, the thickness t of the dicing blade 51 is selected to be substantially equal to the center-to-center distance between the outer grooves of the semiconductor device, i.e., the two grooves 13b located at the inner side with respect to the center of the scribe region II between the two semiconductor element regions (see FIG. 24B).

Note that in FIG. 24B, the shape of a cross section of a relevant part of the dicing blade 51 is illustrated by a broken line.

The dicing blade 51 cuts the organic insulating material (the multilayer structure constituted by the organic insulating materials 6b and 10b) in the two grooves 13b at the inner side with respect to the center of the scribe region II as well as the semiconductor substrate 1 under the grooves 13b.

The multilayer structure constituted by the organic insulating material 6b composed of photosensitive polyimide and filling the second groove 13b and the second organic insulating material layer 10b is exposed in the peripheral side surface of the semiconductor substrate 1 of the individual semiconductor device 400 obtained by dicing.

In other words, the multilayer structure constituted by the second groove 13b, the organic insulating material 6b filling the second groove 13b, and the second organic insulating material layer 10s is exposed in the side surface of the semiconductor device 400 obtained by dicing.

According to this method, the multilevel wiring structure portion including the low-k insulating material in the scribe region II is not cut by the dicing blade 51 and thus delamination of the interlayer insulating layers 4 of the multilevel wiring structure portion or the like does not occur.

The individual semiconductor device 400 produced by dicing has a cross-sectional structure depicted in FIG. 21.

At the time of dicing, there are four strip-shape organic insulating material layers extending parallel to each other in the scribe region II. Thus, the scribe region II is easily recognizable, the alignment of the dicing blade 51 may be facilitated, and the accuracy of alignment may be improved.

Although a high pressure is applied by the dicing blade 51 during dicing, the pressure is absorbed or reduced by the organic insulating material layers in the grooves 13a and 13b. Thus, the high pressure is not applied to the semiconductor element region I.

Fifth Embodiment

A semiconductor device according to a fifth embodiment will now be described.
<Semiconductor Device>

A semiconductor device 500 of the fifth embodiment is depicted in FIG. 25. FIG. 25 is a cross-sectional view of a portion equivalent to the portion depicted in FIG. 2.

As depicted in the drawing, in the semiconductor device 500 also, wiring layers 3 are each depicted as one continuous linear member. However, each wiring layer 3 is actually divided into a power supply line, a ground line, a signal line, etc., on the insulating layer in the semiconductor element region I, and is extended and arranged in accordance with the positions of the functional elements.

Moreover, the wiring layers are interconnected through interlayer connecting portions not depicted in the drawings.

The semiconductor device 500 according to the fifth embodiment differs from the semiconductor device 100 of the first embodiment in the arrangement of the organic insulating material layers disposed in the grooves surrounding the semiconductor element region I.

Thus, parts of the semiconductor device 500 of the fifth embodiment corresponding to the parts of the semiconductor device 100 of the first embodiment are represented by the same reference symbols and the descriptions therefor are omitted to avoid redundancy.

According to the semiconductor device 500 of the fifth embodiment, the organic insulating material is doubly deposited in the first groove 13a and the second groove 13b that surround the semiconductor element region I. Part of the organic insulating material is projected from the multilevel wiring layer 2 by a particular height.

The organic insulating material in the grooves surrounds the semiconductor element region I.

In other words, the organic insulating material doubly deposited in the groove 13a at the semiconductor element region I side is spaced from the organic insulating material layer on the semiconductor element region I and surrounds the semiconductor element region I.

The organic insulating material doubly deposited in the other groove 13b is spaced from the organic insulating material in the groove 13a at the semiconductor element region I side and surrounds the semiconductor element region I.

The organic insulating material in the groove 13b has a side surface continuous with the side surface of the semiconductor substrate 1.

According to the semiconductor device 500 of the fifth embodiment, the organic insulating materials 6a and 6b fill the lower parts of the grooves 13a and 13b and the organic insulating materials 10a and 10b fill the upper part of the grooves 13a and 13b, respectively. The organic insulating materials 10a and 10b project from the multilevel wiring layer 2 by a particular height.

The organic insulating materials projecting from the multilevel wiring layer 2 correspond to the structure described in the third embodiment.

In other words, the organic insulating materials 6a and 6b that fill the lower parts of the grooves 13a and 13b are composed of substantially the same organic insulating material as the organic insulating material layer 6 in the semiconductor element region I.

The organic insulating material layers 10a and 10b fill the recesses 16 in the organic insulating materials 6a and 6b.

The organic insulating materials 10a and 10b are composed of substantially the same as the organic insulating material as the organic insulating material layer (sealing organic insulating material layer) 10 on the semiconductor element region I.

In the fifth embodiment, the reason why the recesses 16 are formed in the upper surfaces of the organic insulating materials 6a and 6b and filled with the organic insulating materials 10a and 10b is the same as that described in the fourth embodiment.

That is, during the selective exposure of the organic insulating material layer 6, the exposure dose of the upper parts of the organic insulating materials 6a and 6b in the grooves 13a and 13b is increased by selecting the exposure conditions and/or the shape, size, etc., of the grooves, and the upper parts of the organic insulating materials 6a and 6b are removed by development.

The second organic insulating material layer 10 formed in the later step fills the recesses 16 and the grooves 13a and 13b to thereby form organic insulating materials 10a and 10b.

The semiconductor device 500 of the fifth embodiment may be made by adequately combining the methods for making semiconductor devices of the first to fourth embodiments.

[Modifications] Various modifications are possible in addition to the embodiments described above.

Although a photosensitive polyimide is used as the organic insulating material in the aforementioned embodiments, the organic insulating material is not limited to the polyimide.

For example, benzocyclobutene (BCB), phenolic resin, epoxy resin, polybenzoxazole (PBO), bismaleimide resin, and the like may be used as the organic insulating material.

Although a positive type photosensitive polyimide is used as the polyimide in the aforementioned embodiments, a negative type photosensitive polyimide may be used as the polyimide.

One of the two polyimide layers disposed on the semiconductor substrate may be composed of a positive type photosensitive polyimide and the other may be composed of a negative type photosensitive polyimide.

Although low-k films are used as the interlayer insulating layers 4 of the multilevel wiring layer 2 in the aforementioned embodiments, the interlayer insulating films are not limited to low-k films.

Silicon oxide films may be used as the interlayer insulating films. When silicon oxide films are used as the interlayer insulating films, falling of pieces during dicing may be prevented.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a semiconductor substrate comprising a semiconductor element region;
    a multilevel wiring layer in the semiconductor substrate;
    a first insulating material layer disposed on the multilevel wiring layer;
    a groove that penetrates the multilevel wiring layer in a scribe region that surrounds the semiconductor element region; and
    an insulating material disposed in the groove,
    wherein the insulating material and the first insulating material layer are separated from each other by a surface protection layer of the multilevel wiring layer.

2. The semiconductor device according to claim 1, further comprising:
    a wiring layer disposed on the first insulating material layer; and
    a second insulating material layer covering the wiring layer.

3. The semiconductor device according to claim 1, wherein the insulating material disposed in the groove is composed of the same material as an insulating material forming the first organic insulating material layer.

4. The semiconductor device according to claim 1, wherein the groove comprises a plurality of grooves extending parallel to each other, the grooves being formed in the multilevel wiring layer on the scribe region.

5. The semiconductor device according to claim 1, wherein the groove comprises a first groove and a second groove that is spaced from the first groove and surrounds the semiconductor element region, and
    the insulating material disposed in the second groove is exposed in a side surface of the semiconductor substrate.

6. The semiconductor device according to claim 1, wherein the multilevel wiring layer includes an interlayer insulating layer composed of an insulating material having a low dielectric constant.

7. The semiconductor device according to claim 1, wherein the insulating material layer and the insulating material in the groove contain a polyimide, benzocyclobutene, a phenolic resin, an epoxy resin, polybenzoxazole, or a bismaleimide resin.

8. The semiconductor device according to claim 2, wherein the insulating material layer and the insulating material in the groove contain a polyimide, benzocyclobutene, a phenolic resin, an epoxy resin, polybenzoxazole, or a bismaleimide resin.

9. The semiconductor device according to claim 3, wherein the insulating material layer and the insulating material in the groove contain a polyimide, benzocyclobutene, a phenolic resin, an epoxy resin, polybenzoxazole, or a bismaleimide resin.

10. The semiconductor device according to claim 4, wherein the insulating material layer and the insulating material in the groove contain a polyimide, benzocyclobutene, a phenolic resin, an epoxy resin, polybenzoxazole, or a bismaleimide resin.

11. The semiconductor device according to claim 5, wherein the insulating material layer and the insulating material in the groove contain a polyimide, benzocyclobutene, a phenolic resin, an epoxy resin, polybenzoxazole, or a bismaleimide resin.

12. The semiconductor device according to claim 6, wherein the insulating material layer and the insulating material in the groove contain a polyimide, benzocyclobutene, a phenolic resin, an epoxy resin, polybenzoxazole, or a bismaleimide resin.

13. A semiconductor device comprising:
a semiconductor substrate comprising a semiconductor element region;
a multilevel wiring layer in the semiconductor substrate;
a first insulating material layer disposed on the multilevel wiring layer;
a plurality of grooves that penetrate the multilevel wiring layer that surrounds the semiconductor element region; and
an insulating material disposed in the plurality of the grooves,
wherein the insulating material and the first insulating material layer are separated from each other by a surface protection layer of the multilevel wiring layer, and
wherein the insulating material disposed in one of the plurality of grooves is exposed to peripheral side surface of the semiconductor substrate.

14. The semiconductor device according to claim 13, wherein the insulating material disposed in the plurality of grooves is composed of the same material as an insulating material forming the first insulating material layer.

15. The semiconductor device according to claim 13, wherein the insulating material layer and the insulating material in the plurality of grooves contain a polyimide, benzocyclobutene, a phenolic resin, an epoxy resin, polybenzoxazole, or a bismaleimide resin.

16. The semiconductor device according to claim 13, wherein the plurality of grooves are extending parallel to each other, and one of the grooves being formed in the multilevel wiring layer on the scribe region.

17. A semiconductor device comprising:
a semiconductor substrate comprising a semiconductor element region;
a multilevel wiring layer in the semiconductor substrate;
a first insulating material layer disposed on the multilevel wiring layer;
a first groove that penetrates the multilevel wiring layer that surrounds the semiconductor element region;
a first insulating material disposed in the groove; and
a second insulating material disposed in the first insulating material,
wherein the first insulating material layer is separated from the first insulating material and the second insulating material by a surface protection layer of the multilevel wiring layer, and
wherein first insulating material and second insulating material is exposed to peripheral side surface of semiconductor substrate.

18. The semiconductor device according to claim 17, further comprising a second groove that penetrates the multilevel wiring layer and extends parallel to the first groove.

* * * * *